(12) United States Patent
Kato et al.

(10) Patent No.: US 7,510,782 B2
(45) Date of Patent: Mar. 31, 2009

(54) BORON-CONTAINING POLYMER COMPOUND AND ORGANIC LIGHT EMITTING DEVICE USING THE SAME

(75) Inventors: Tsuyoshi Kato, Chiba (JP); Kunio Kondo, Chiba (JP)

(73) Assignee: Showa Denko K.K., Tokyo (JP)

( * ) Notice: Subject to any disclaimer, the term of this patent is extended or adjusted under 35 U.S.C. 154(b) by 374 days.

(21) Appl. No.: 10/583,389

(22) PCT Filed: Dec. 10, 2004

(86) PCT No.: PCT/JP2004/018859

§ 371 (c)(1),
(2), (4) Date: Jun. 19, 2006

(87) PCT Pub. No.: WO2005/061562

PCT Pub. Date: Jul. 7, 2005

(65) Prior Publication Data

US 2007/0167588 A1    Jul. 19, 2007

Related U.S. Application Data

(60) Provisional application No. 60/532,919, filed on Dec. 30, 2003.

(30) Foreign Application Priority Data

Dec. 19, 2003    (JP)    ............................. 2003-422040

(51) Int. Cl.
*H01L 51/54* (2006.01)
*C08F 30/06* (2006.01)
*C09K 11/06* (2006.01)

(52) U.S. Cl. ...................... 428/690; 428/917; 313/504; 257/40; 526/239; 526/241; 252/301.16; 252/301.35

(58) Field of Classification Search ................. 313/504; 526/239, 241; 252/301.16, 301.35; 257/40, 257/E51.033, E51.036, E51.044

See application file for complete search history.

(56) References Cited

U.S. PATENT DOCUMENTS 4,885,211  A    12/1989  Tang et al.

FOREIGN PATENT DOCUMENTS

EP    1142895 A1    10/2001

(Continued)

OTHER PUBLICATIONS

Translation for JP 2000-297118 A, published Oct. 2000.*

(Continued)

*Primary Examiner*—Dawn Garrett
(74) *Attorney, Agent, or Firm*—Sughrue Mion, PLLC

(57) ABSTRACT

The present invention provides a polymer material showing high luminous efficiency at a low voltage and suitable for increasing the emission area and for the mass production, and an organic light emitting device using the same. The present invention relates to a polymer compound comprising a boron-containing monomer unit represented by formula (1): [in the formula, A represents a triphenyl boron group in which the phenyl group may be substituted, $R^{16}$ represents a hydrogen atom or an alkyl group having 1 to 12 carbon atoms. X represents a single bond, —O—, —S—, —SO—, —$SO_2$— or a divalent hydrocarbon group having 1 to 20 carbon atoms which may have a hetero atom], a light-emitting polymer compound comprising the boron-containing monomer unit and a light-emitting monomer unit, a light-emitting composition comprising the boron-containing monomer unit and a light-emitting low-molecular compound or light-emitting polymer compound, and organic light-emitting device using the light-emitting polymer compound or the light-emitting composition.

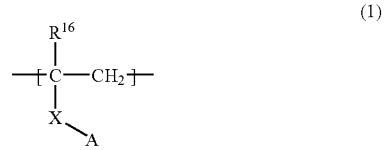

(1)

14 Claims, 1 Drawing Sheet

FOREIGN PATENT DOCUMENTS

| | | | |
|---|---|---|---|
| EP | 1217668 | A1 | 6/2002 |
| JP | 2-015595 | A | 1/1990 |
| JP | 5-121172 | A | 5/1993 |
| JP | 8-157575 | A | 6/1996 |
| JP | 10-001665 | A | 1/1998 |
| JP | 2000-297118 | A  * | 10/2000 |
| JP | 2003-113246 | A | 4/2003 |
| WO | WO 00/40586 | A1 | 7/2000 |

OTHER PUBLICATIONS

Patent Abstracts of Japan, vol. 2003, No. 8, Aug. 6, 2003 & JP 2003 113246 A (Show a Denko KK), Apr. 18, 2003.

Patent Abstracts of Japan, vol. 2000, No. 13, Feb. 5, 2001 & JP 2000 297118 A (Hokko Chem Ind Co Ltd), Oct. 24, 2000.

* cited by examiner

BORON-CONTAINING POLYMER COMPOUND AND ORGANIC LIGHT EMITTING DEVICE USING THE SAME

CROSS-REFERENCE TO RELATED APPLICATIONS

This is an application filed pursuant to 35 U.S.C. Section 111(a) with claiming the benefit of U.S. provisional application Ser. No. 60/532,919 filed Dec. 30, 2003 under the provision of 35 U.S.C. 111(b), pursuant to 35 U.S.C. Section 119(e) (1).

TECHNICAL FIELD

The present invention relates to an organic light emitting device (OLED) used for backlights in flat display panels or the like. More specifically, the present invention relates to a boron-containing polymer compound used for a light-emitting layer in an organic light emitting device and an organic light emitting device using the polymer compound.

BACKGROUND ART

Materials and structures of organic light emitting devices have been improved rapidly since C. W. Tang, et al. of Eastman Kodak Company demonstrated a high-luminance in 1987, and the devices have recently been put into practical use in displays of car audio systems and cellular phones, etc. To further widen the application of these organic EL (electroluminescent) devices, materials for increasing the light emitting efficiency or the durability, full-color display systems, etc. are now being actively developed. Particularly in view of applying the devices to middle- or large-sized panels and illuminators, the light emitting efficiency needs to be increased to achieve a higher luminance. However, conventional organic EL devices utilize light emission from an excited singlet state, that is, fluorescence, and since the formation ratio of singlet excitons to triplet excitons is 1/3 in electroexcitation, the upper limit of the internal quantum efficiency in organic light emitting device is 25% (equivalent to the external quantum efficiency of 5% when the external extraction efficiency is 20%).

Under the circumstances, M. A. Baldo, et al. disclosed that an iridium complex, etc. capable of emitting phosphorescence in the excited triplet state at the room temperature can achieve the external quantum efficiency of 7.5% (equivalent to the internal quantum efficiency of 37.5% when the external extraction efficiency is assumed to be 20%), which exceeds the conventional external quantum efficiency upper limit of 5%. Further, a higher efficiency of almost 20% was achieved by modifying a host material or structure of the device (*Appl. Phys. Lett.*, Vol. 90, P. 5048, 2001), and this has been attracting attention as a method for achieving an extra-high efficiency.

However, this phosphorescent iridium complex is a low molecular weight compound and is formed into a film by a vacuum deposition method. Though the vacuum deposition method has been widely used for forming films of low molecular weight light emitting materials, the method is disadvantageous in that a vacuum apparatus is required and that the larger the area of the organic film to be formed is, the more difficult it is to form the film with a uniform thickness or a highly defined pattern. Thus, the method is not necessarily suitable for mass production of a large area panel.

In the circumstances, in relation to method suitable for producing device having a larger light-emission area and mass production method therefor, methods of forming light emitting polymer materials into films by spin coating methods, ink-jet methods, printing methods, etc. have been developed. These technologies have been widely used for fluorescent polymer materials and also, application of such a method in phosphorescent polymer materials is being developed. It has been reported that an external quantum efficiency of more than 5% can be obtained by using a phosphorescent polymer material with a side chain containing a phosphorescent moiety and a carrier transporting moiety (*Proceedings of The 11th International Workshop on Inorganic and Organic Electroluminescence (EL2002)*, p. 283-286, 2002).

However, the above phosphorescent polymer material shows an external quantum efficiency of about 6%, which is only slightly more than the external quantum efficiency limit 5% of the fluorescent devices. Thus, this material cannot achieve the expected high external quantum efficiency of the phosphorescent devices.

Meanwhile, many research institutes have been making various attempts to apply pi-electron-based organic compounds to optical materials or electronic function materials. Particularly, as to boron compound having a boron atom in its molecule, the presence of an empty p-orbital in the boron atom is expected to contribute to exhibiting highly specific optical and electronic properties. However, generally, a boron compound, which has a disadvantage of being unstable in air and water, is not suitable for use as a material. In relation to this problem, there have been recent reports that a boron compound can be made stable in air and water by allowing the compound to have a bulky structure (see, for example, *Journal of American Chemical Society*, Vol. 120 p. 10776, 1998), and thus the potentiality of boron compound to be used in non-linear optical material, organic EL material or the like has been explored. However, such study reports only describe about the fluorescent property of the compound in a solution state, and it is still the case that study results so far obtained are too immature to put a boron compound having a bulky structure into practical use. Particularly, there are strong demands for application of boron compound to organic EL material, and although studies on technologies of this kind have been vigorously made, none of the studies has developed a technology where sufficient properties are exhibited. An organic EL device basically comprises a structure where a charge-transporting layer and/or an organic compound serving as light-emitting material are sandwiched between two electrodes. An organic EL device is desired to have a high efficiency at low power consumption, and for this purpose, it is necessary to use an organic compound serving as a material which exhibits high luminous efficiency.

There is an article on a research where a boron compound containing a heterocyclic ring is used as a charge-transporting agent (*Journal of American Chemical Society*, Vol. 120 p. 9714, 1998), however, the article does not refer to light emitting property or suitability as a light-emitting material of the boron compound at all. The article only includes a report implying that a device containing the boron compound, owing to its lower current density, exhibited an improved luminous efficiency at the same luminance level as compared with a device not containing a boron compound. Moreover, the boron compound used therein, being a low-molecular weight compound, requires a film-forming method by vacuum deposition or the like as described above which is not always suitable for mass-production process of large-area panels. The international publication WO00/40586 discloses an example using a boron compound in an organic EL device, however, the boron compound used therein is also a low-molecular weight compound and only exhibits a low efficiency, leaving unsolved the problem involved in the above-mentioned research article.

DISCLOSURE OF THE INVENTION

Though high-efficient light-emitting polymer materials suitable for increasing emission area and for mass production have been developed, a light-emitting material and an organic light emitting device using the same capable of showing a sufficiently high luminous efficiency at a low voltage have not yet been obtained.

Accordingly, an object of the present invention is to provide a polymer material which can show a high luminous efficiency at a low voltage and is suitable for increasing the emission area and for the mass production, and an organic light emitting device using the same.

As a result of various researches with the view that the conventional polymer materials require high driving voltage and show a low power efficiency because of the oxadiazole structure of the electron transporting moiety, the inventors have found that the driving voltage can be reduced and the external quantum efficiency can be increased by using a polymer material having a triaryl boron structure in the electron transporting moiety. The present invention has been accomplished by this finding.

Thus, the present invention relates to the following organic light emitting device.

1. A polymer compound characterized by comprising a monomer unit represented by formula (1):

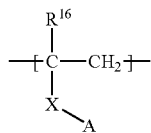

(1)

[in the formula, A represents a triphenyl boron group in which the phenyl group may be substituted, $R^{16}$ represents a hydrogen atom or an alkyl group having 1 to 12 carbon atoms. X represents a single bond, —O—, —S—, —SO—, —SO$_2$— or a divalent hydrocarbon group having 1 to 20 carbon atoms which may have a hetero atom.]

2. The polymer compound as described in 1 above, comprising a monomer unit represented by formula (2):

(2)

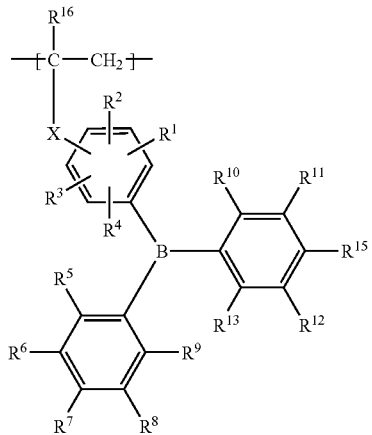

[in the formula, $R^{16}$ and X have the same meanings as defined in above 1 respectively, $R^1$ to $R^{15}$ independently represent a hydrogen atom, a halogen atom, a cyano group, an amino group, a hydrocarbon alkyl group having 1 to 12 carbon atoms, an alkoxy group having 1 to 12 carbon atoms, an aryloxy group, an aromatic group or a heterocyclic group. Among $R^1$ to $R^{15}$, those adjacent to each other on one phenyl group may be bonded to form a condensed ring.]

3. The polymer compound as described in 2 above, wherein in the monomer unit represented by formula (2), at least four of $R^1$, $R^4$, $R^5$, $R^9$, $R^{10}$ and $R^{13}$ each represent an alkyl group having 1 to 6 carbon atoms or alkoxy group having 1 to 6 carbon atoms (provided that $R^1$ and $R^4$ are at ortho positions with respect to the substitution position of the boron atom).

4. The polymer compound as described in 2 or 3 above, comprising a monomer unit represented by formula (3):

(3)

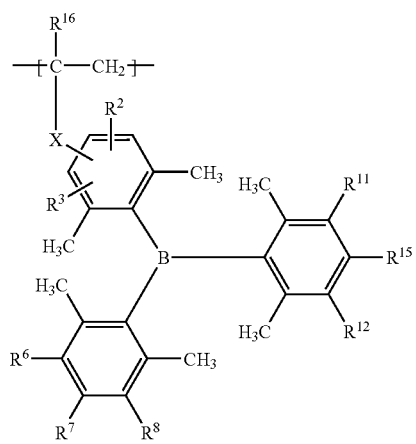

[in the formula, $R^2$, $R^3$, $R^6$ to $R^8$, $R^{11}$, $R^{12}$, $R^{15}$ and $R^{16}$ represent the same meanings as defined in above 2.]

5. The polymer compound as described in 2 or 3 above, comprising a monomer unit represented by formula (4):

(4)

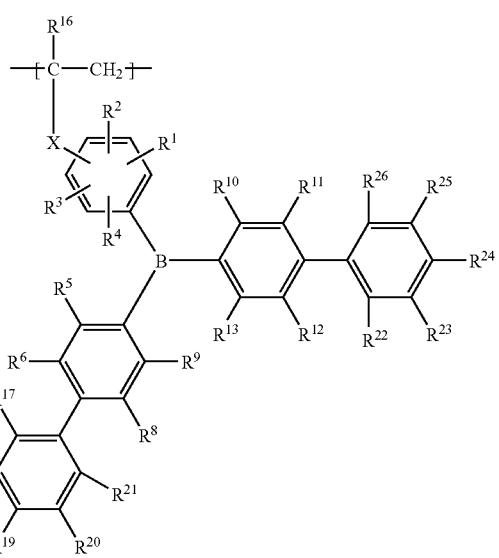

[in the formula, $R^1$ to $R^6$, $R^8$ to $R^{13}$ and $R^{16}$ have the same meanings as defined in above 2 respectively, $R^{17}$ to $R^{26}$ independently represent a hydrogen atom, a halogen atom, a cyano group, an amino group, a hydrocarbon alkyl group having 1 to 12 carbon atoms, an alkoxy group having 1 to 12 carbon atoms, an aryloxy group, an aromatic group or a heterocyclic group. Among $R^{17}$ to $R^{26}$, those adjacent to each other on one phenyl group may be bonded with each other to form a condensed ring.]

6. The polymer compound as described in any one of 2 to 5 above, which is a light-emitting polymer compound comprising the monomer unit represented by formula (2) described in 2 above and a light-emitting monomer unit.
7. The light-emitting polymer compound as described in 6 above, wherein light emitted by the light-emitting monomer unit is phosphorescence.
8. The light-emitting polymer compound as described in 7 above, wherein the light-emitting monomer contains a transition metal complex.
9. The light-emitting polymer compound as described in 8 above, wherein the light-emitting monomer unit contains a metal selected from metals of atomic numbers 39 to 48 and 72 to 80.
10. The light-emitting polymer compound as described in any one of 2 to 9 above, wherein the light-emitting polymer compound contains a hole-transporting monomer unit.
11. A light-emitting composition, comprising a polymer compound containing the monomer unit represented by formula (2) described in 2 above and a light-emitting compound.
12. The light-emitting composition as described in 11 above, wherein the light-emitting compound is a low molecular weight compound or a polymer compound.
13. An organic light-emitting device comprising one or more polymer layers between an anode and a cathode, wherein at least one of the polymer layers present between the anode and the cathode comprises the light-emitting polymer compound described in any one of 6 to 9 above.
14. An organic light-emitting device comprising one or more polymer layers between an anode and a cathode, wherein at least one of the polymer layers present between the anode and the cathode comprises the light-emitting composition described in 11 or 12 above.
15. A light source for surface emission, a backlight for a display unit, a display unit, an illumination device or an interior or exterior accessory using the light-emitting device described in 13 or 14 above.

DETAILED DESCRIPTION OF INVENTION

Embodiments of the present invention will be specifically described hereinbelow.

The polymer compound of the present invention contains at least a boron-containing monomer unit represented by formula (1).

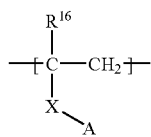

(1)

In the formula, A represent a triphenyl boron group in which the phenyl group may be substituted, $R^{16}$ represents a hydrogen atom or an alkyl group having 1 to 12 carbon atoms. X represents a single bond, —O—, —S—, —SO—, —$SO_2$— or a divalent hydrocarbon group having 1 to 20 carbon atoms which may have a hetero atom.

The boron-containing monomer unit represented by formula (1) may be more specifically represented by formula (2).

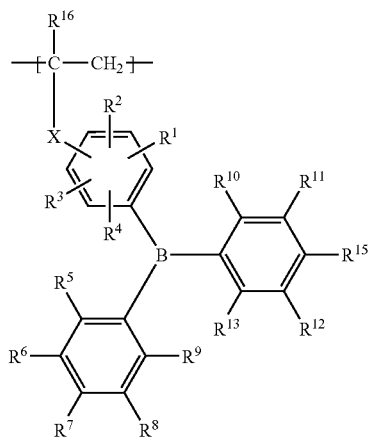

(2)

In the formula, $R^{16}$ and X each have the same meanings as defined above, and $R^1$ to $R^{15}$ each represent a hydrogen atom, a halogen atom, a cyano group, an amino group, a hydrocarbon alkyl group having 1 to 12 carbon atoms, an alkoxy group having 1 to 12 carbon atoms, an aryloxy group, an aromatic group or a heterocyclic group. Among $R^1$ to $R^{15}$, those adjacent to each other on one phenyl group may be bonded to each other to form a condense ring.

The monomer unit represented by formula (2) consists of a moiety having a triarylboron structure, a moiety forming a polymer chain derived from carbon-carbon double bond and a linking group X connecting these moieties. A high electron mobility in the triarylboron structure enables low-voltage drive, resulting in obtaining a high external quantum efficiency. That is, the monomer unit represented by formula (2) functions as an electron-transporting moiety.

In the formula (2), examples of $R^1$ to $R^{15}$ include a hydrogen atom, a halogen atom, a cyano group, an amino group, a hydrocarbon alkyl group having 1 to 12 carbon atoms, an alkoxy group having 1 to 12 carbon atoms, an aryloxy group, an aromatic group and a heterocyclic group. Examples of halogen atom used for $R^1$ to $R^{15}$ include a fluorine atom, a chlorine atom, a bromine atom, and an iodine atom. Examples of the hydrocarbon alkyl group having 1 to 12 carbon atoms for $R^1$ to $R^{15}$ include a methyl group, an ethyl group, a propyl group, an isopropyl group, a butyl group, an isobutyl group, a t-butyl group, an amyl group, a hexyl group, an octyl group, a decyl group and a dodecyl group. Examples of the alkoxy group having 1 to 12 carbon atoms for $R^1$ to $R^{15}$ include a methoxy group, an ethoxy group, a propoxy group, an isopropoxy group, an isobutoxy group, a t-butoxy group, a hexyloxy group, an octyloxy group, a decyloxy group and a dodecyloxy group. Examples of the aryloxy group used for $R^1$ to $R^{15}$ include a phenoxy group, a 4-methylphenoxy group, a naphthyloxy group, and an anthranyloxy group. Examples of the aromatic group used for $R^1$ to $R^{15}$ include a phenyl group, a biphenyl group, a terphenyl group, a tolyl group, a xylyl group, a mesityl group, a naphthyl group, an anthryl group and a phenanthryl group. Examples of the heterocyclic group used for $R^1$ to $R^{15}$ include a pyridyl group, a pyrrole group, a furanyl group, a thiophene group, a pyrazole group, an imidazole group, a triazole group, a tetrazole group, an oxazole group, an oxadiazole group, a thiazole group, a thiadiazole group, an indole group, a carbazole group, a benzofuranyl group, a benzothiophene group, a benzoimidazole group, a benzotriazole group, a benzoxazole group, a benzothiazole group, a benzodithiazole group and a furyl group. Among $R^1$ to $R^{15}$, those adjacent to each other on one phenyl group may be bonded to each other to form a condense ring.

In order for the boron compound to be stable in air or water, it is desirable that the aromatic ring have substituent(s) at ortho position(s) and have a substituent at the $4^{th}$ position.

$R^{16}$ in formula (2) may be a hydrogen atom or an alkyl group having 1 to 12 carbon atoms. Examples of the alkyl group having 1 to 12 carbon atoms used for $R^{16}$ include a methyl group, an ethyl group, a propyl group, an isopropyl group, a butyl group, an isobutyl group, a t-butyl group, an amyl group, a hexyl group, an octyl group, a decyl group and a dodecyl group.

Preferable examples of triarylboron structure in formula (2) may include structures represented by formulae (A-1) to (A-15) below.

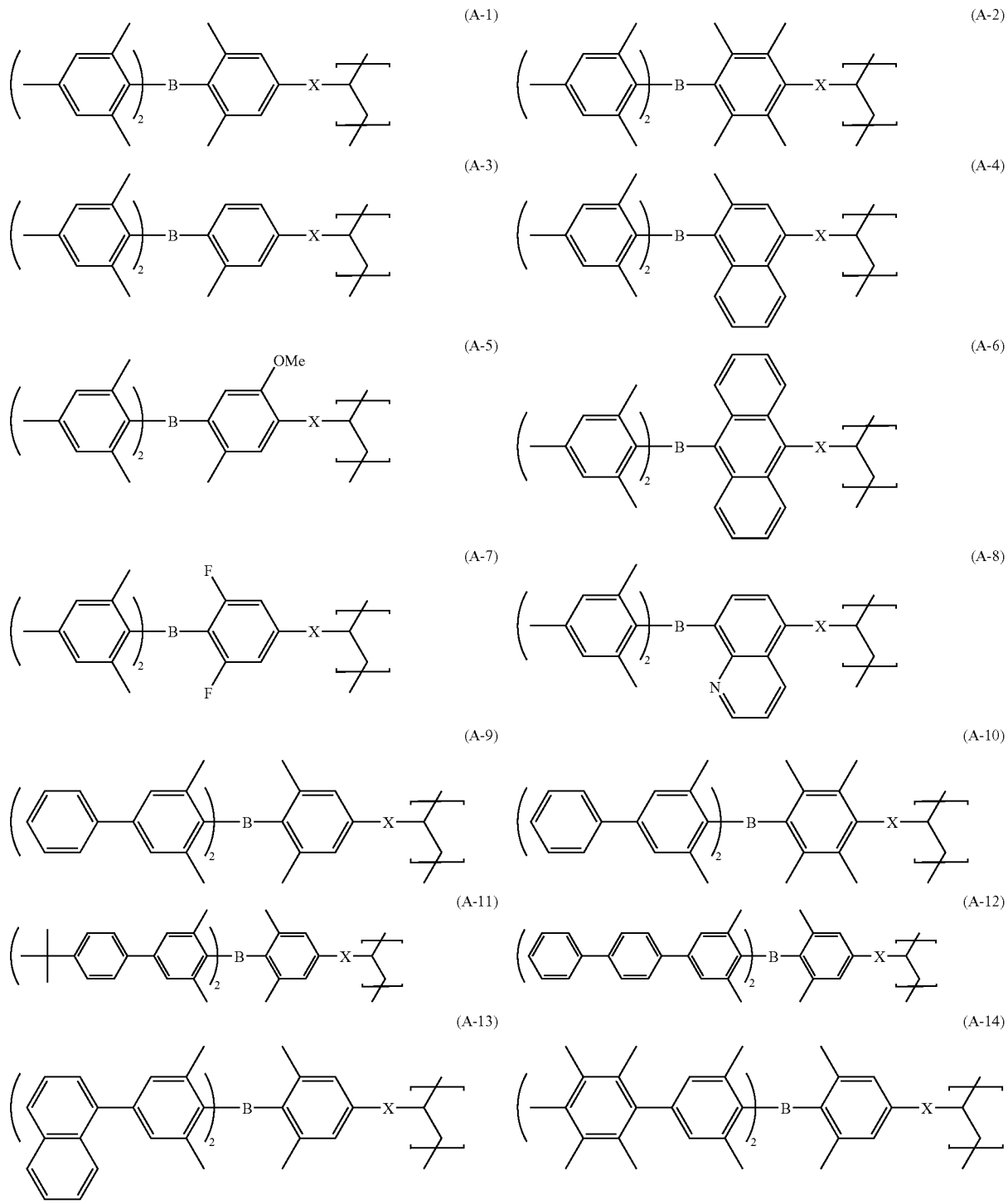

(A-15)
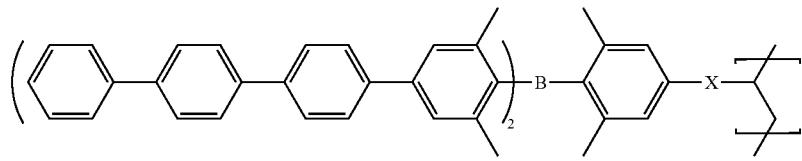

Examples of the linking group X in formula (2) may include a single bond, —O—, —S—, —SO— or a divalent organic group having 1 to 20 carbon atoms which may have a hetero atom. Examples of the divalent organic group having 1 to 20 carbon atoms used for the linking group X may include groups having structures represented by formulae (S-1) to (S-15) below.

(S-1)
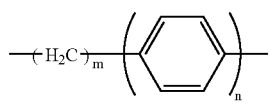

(S-2)
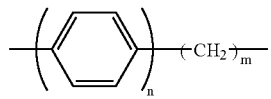

(S-3)
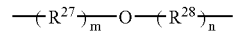

(S-4)
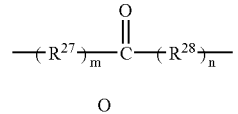

(S-5)
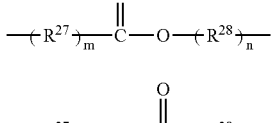

(S-6)
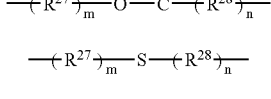

(S-7)
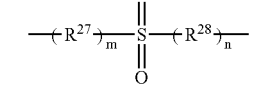

(S-8)

(S-9)
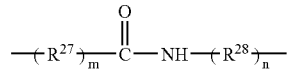

(S-10)
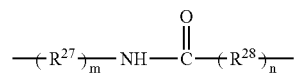

(S-11)
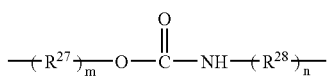

(S-12)
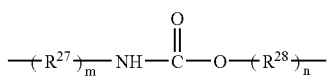

(S-13)
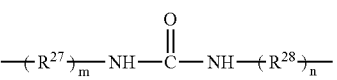

(S-14)

(S-15)
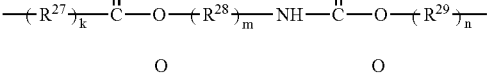

$R^{27}$, $R^{28}$ and $R^{29}$ in the above formulae each independently represent a methylene group or a substituted or unsubstituted phenylene group. The symbols, k, m and n each independently represent 0, 1 or 2, provided that in formulae (S-3), (S-7) and (S-8), m and n do not represent 0 at the same time.

Preferable examples of triarylboron- structure in formula (2) may further include structures represented by formulae (B-1) to (B-23) below. Particularly preferred among them are (B-4), (B-6), (B-19), (B-21), (B-22) and (B-23).

(B-1)

(B-2)

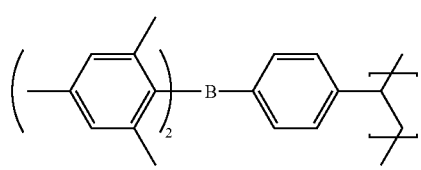

(B-3)

(B-4)

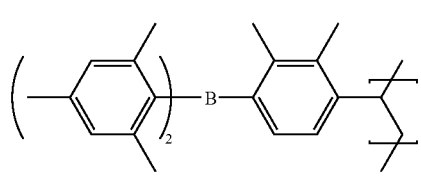

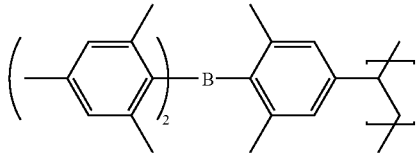

-continued
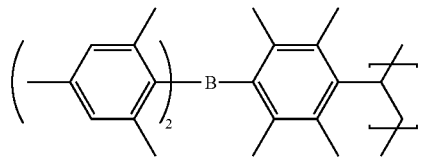
(B-5)
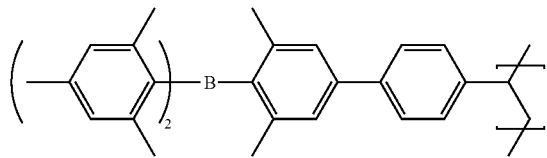
(B-6)
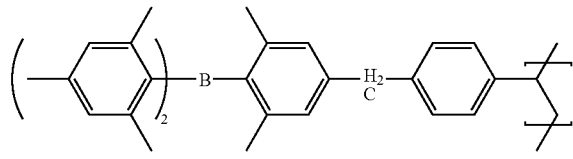
(B-7)
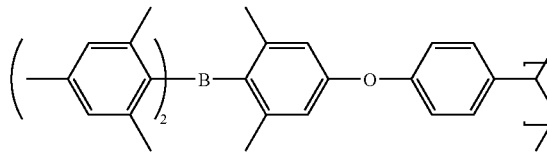
(B-8)
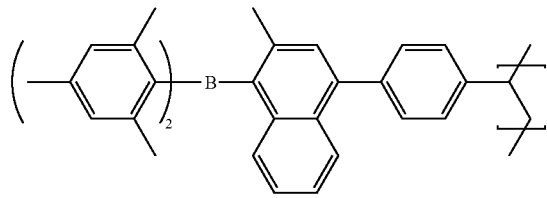
(B-9)
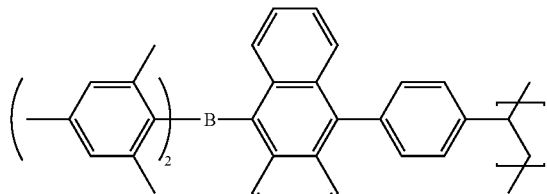
(B-10)
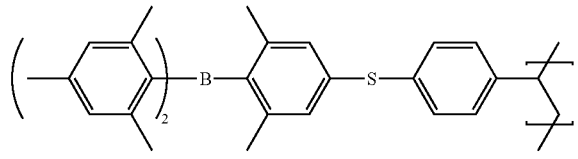
(B-11)
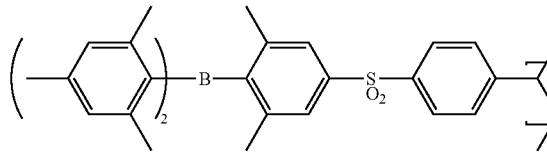
(B-12)
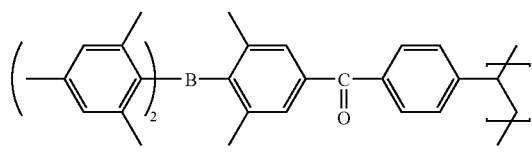
(B-13)
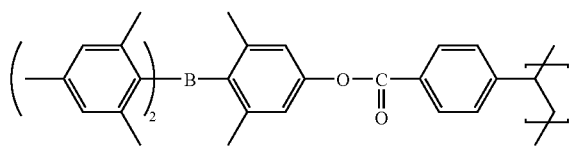
(B-14)
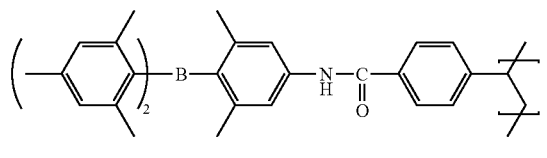
(B-15)
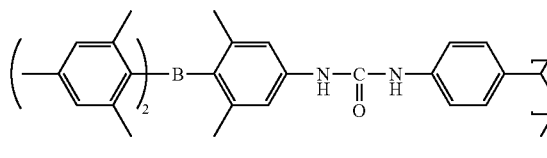
(B-16)
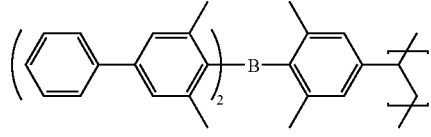
(B-17)
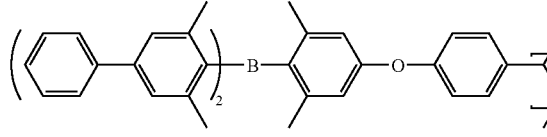
(B-18)
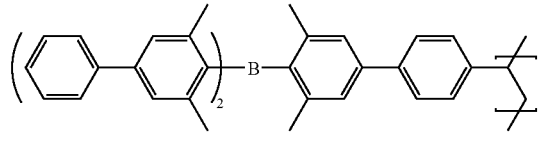
(B-19)
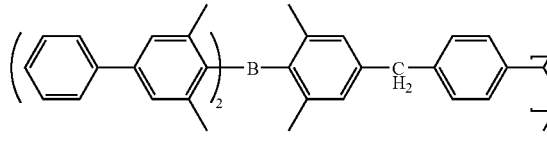
(B-20)
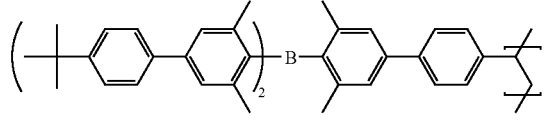
(B-21)
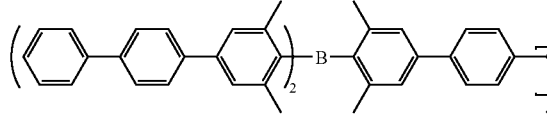
(B-22)

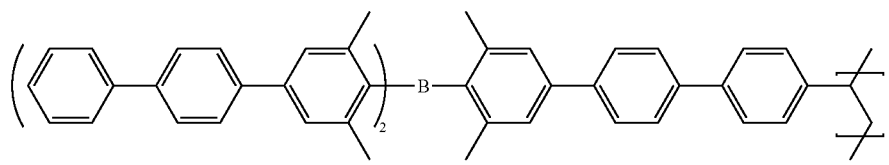

(B-23)

In the polymer compound of the present invention, when the number of times for repeating the monomer unit represented by formula (2) is t and the number of times for repeating the other monomer units is u, the ratio of the number of times for repeating the monomer unit represented by formula (2) in the present invention against the total number of times for repeating all the monomer units, that is, t/(t+u) is preferably within a range of 0.01 to 1.00, more preferably 0.1 to 0.9.

The polymer compound of the present invention may contain a light-emitting monomer unit. In that case, the monomer unit consists of a light-emitting moiety, a moiety forming a polymer chain derived from carbon-carbon double bond and a linking group connecting these moieties. Here, the light emission may be fluorescence or phosphorescence, preferably phosphorescence.

As a fluorescent light emitting moiety in the light-emitting monomer unit, a compound which emits fluorescence at room temperature may be used. Examples of the compound include compounds described in Ouyou-Butsuri (Applied Physics) Vol. 70, No. 12, p. 1419, 2001.

As a phosphorescent light emitting moiety in the light-emitting monomer unit, a compound which emits phosphorescence at room temperature may be used, and preferred is a transition metal complex. Examples of the transition metal used for the transition metal complex include the first transition metal series, that is, from Sc of atomic number 21 to Zn of atomic number 30, the second transition metal series, that is, from Y of atomic number 39 to Cd of atomic number 48, and the third transition metal series, that is, from Hf of atomic number 72 to Hg of atomic number 80 in the Periodic Table Preferred among the transition metals are Pd, Os, Ir, Pt and Au, more preferred are Ir and Pt, and even more preferred is Ir.

As ligand in the above transition metals, those described in G. Wilkinson, Comprehensive Coordination Chemistry (Plenum Press, 1987) and those described in Akio Yamamoto, Yukikinzoku kagaku-kiso to oyo (basics and applications in organic chemistry), published by Shokabo, 1982 may be used. Among them, preferred are halogen ligand, nitrogen-containing hetero ring ligand (phenylpyridine ligand, benzothienylpyridine ligand, benzoquinoline ligand, quinolinol ligand, bipyridyl ligand, terpyridine ligand, phenanthroline ligand etc.), diketone ligand (acetylacetone ligand, dipivaroylmethane ligand etc.), carboxylic acid ligand (acetic acid ligand and the like), phosphorous ligand (triphenylphosphine ligand, phosphorous ester ligand etc.), carbon monoxide ligand, isonitryl ligand and cyano ligand.

Preferable examples of ligand in the transition metal complex may include those having structures represented by formulae (L-1) to (L-13) below.

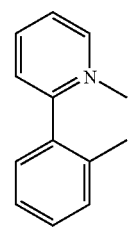

(L-1)

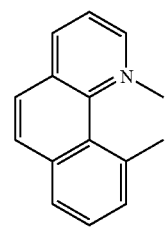

(L-2)

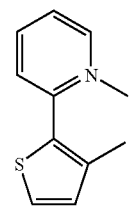

(L-3)

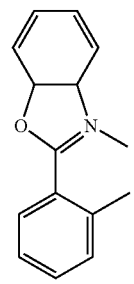

(L-4)

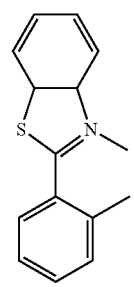

(L-5)

-continued

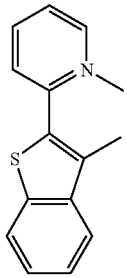
(L-6)

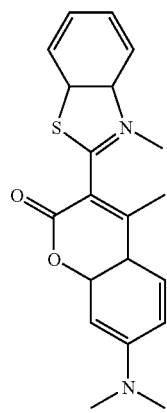
(L-7)

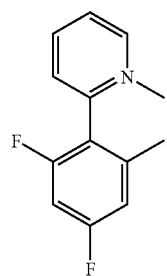
(L-8)

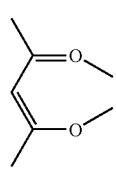
(L-9)

-continued

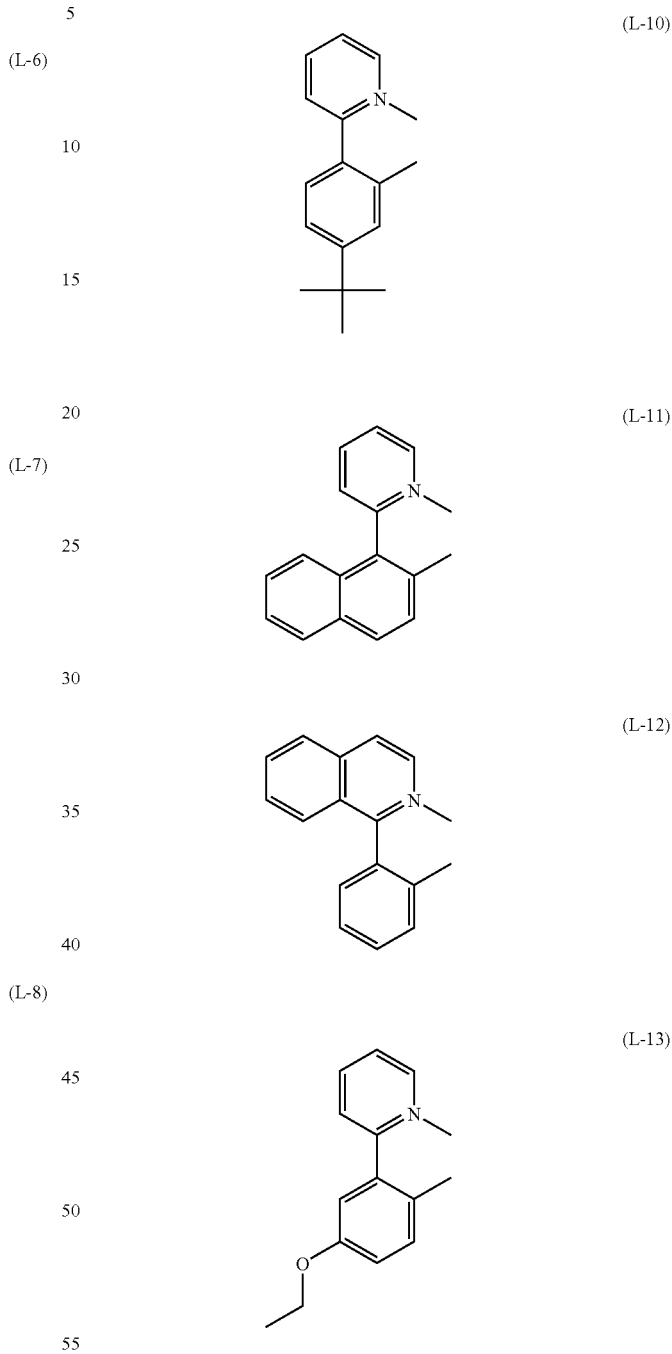

Further, two or more kinds of ligands may be contained in a transition metal complex. Furthermore, as the transition metal complex, bi- or multi-nuclear complex may be used.

The linking group in the light-emitting monomer unit connects a moiety forming a polymer chain derived from carbon-carbon double bond and the above transition metal complex. Examples of the linking group include a single bond, —O—, —S—, —SO—, —SO$_2$— and a divalent hydrocarbon group having 1 to 20 carbon atoms which may have a hetero atom. Examples of the divalent hydrocarbon group having 1 to 20 carbon atoms include those having structure represented by formulae (S-1) to (S-15) as in the case of the linking group X in formula (2).
Preferable examples of the light-emitting monomer unit in the present invention may include those having structures represented by formulae (D-1) to (D-11) below.
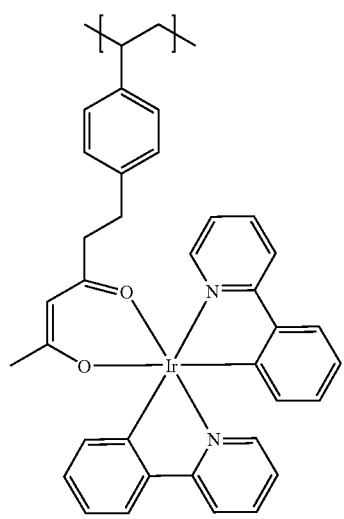
(D-1)
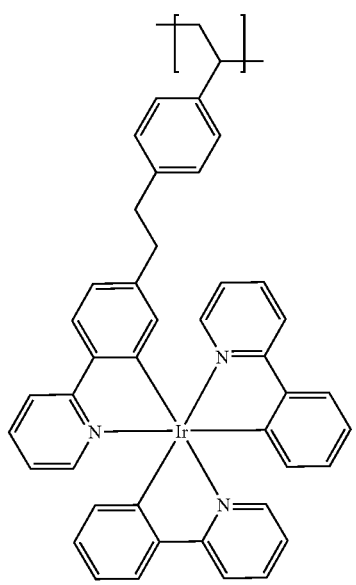
(D-2)
-continued
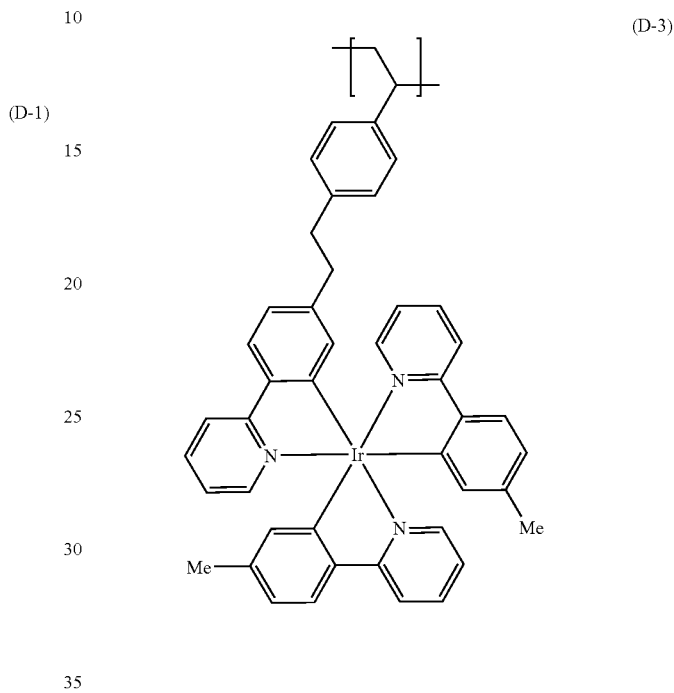
(D-3)
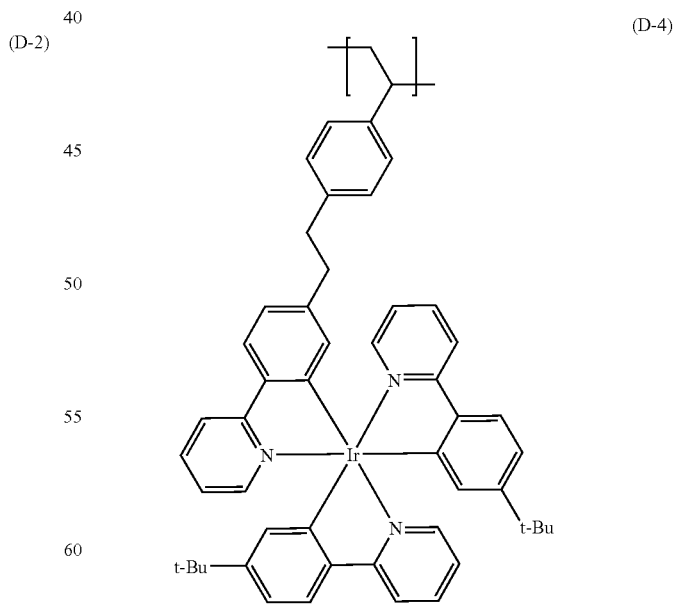
(D-4)

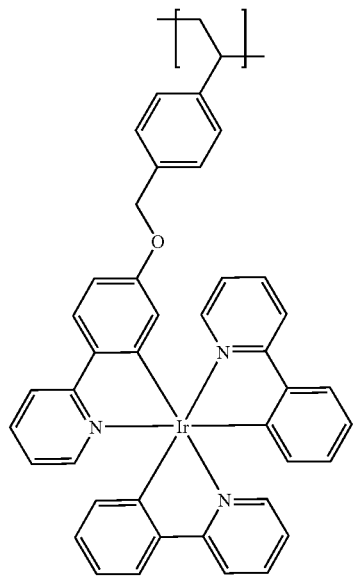
(D-5)
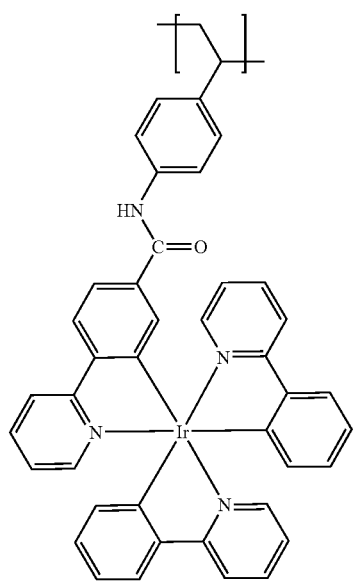
(D-6)
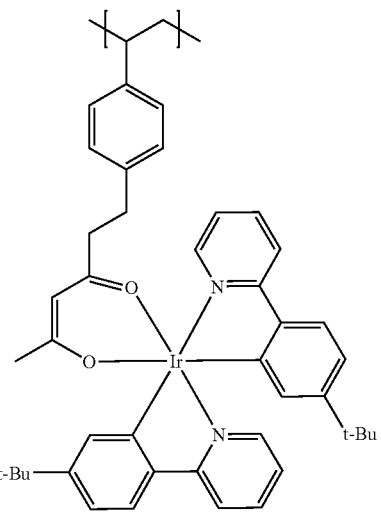
(D-7)
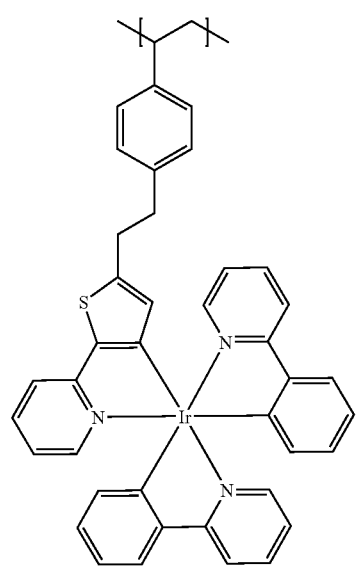
(D-8)
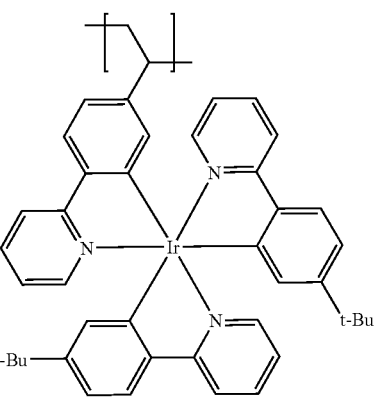
(D-9)

-continued (D-10)

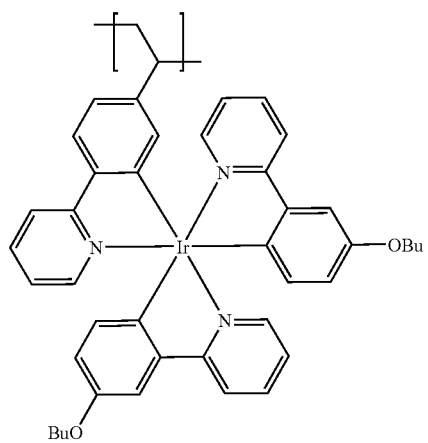

(T-1)

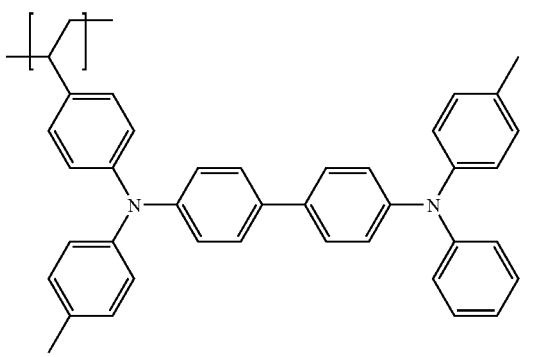

(D-11)

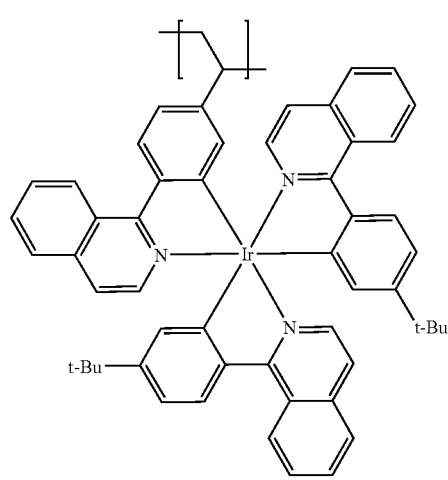

(T-2)

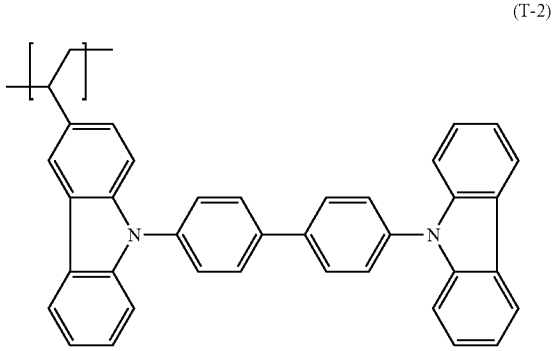

(T-3)

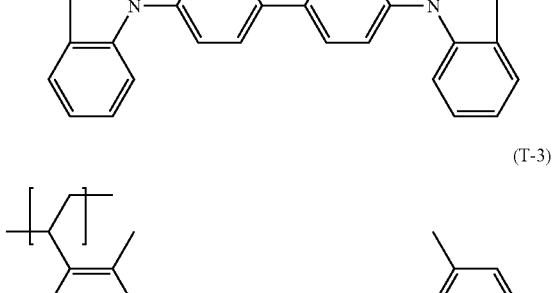

(T-4)

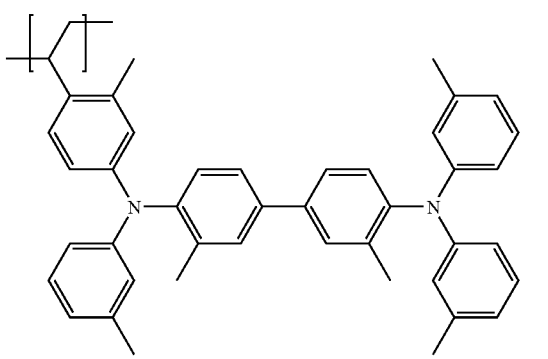

In the polymer compound of the present invention, when the number of times for repeating the light-emitting monomer unit is r and the number of times for repeating the other monomer units (inclusive of the monomer unit represented by formula (2)) is s (r and s each are an integer of 1 or more), the ratio of the number of times for repeating the light-emitting monomer unit against the total number of times for repeating the monomer units, that is r/(r+s) is preferably within a range of 0.0001 to 0.3, more preferably 0.001 to 0.2.

With respect to monomer arrangement in the copolymer, the copolymer may be random-type copolymer, block-type copolymer or alternate-type copolymer.

Also, in addition to the monomer unit represented by formula (2), the polymer compound of the present invention may contain a hole-transporting monomer unit.

Examples of hole-transporting moiety in the hole-transporting monomer unit include triphenylamine derivatives such as TPD(N,N'-diphenyl-N,N'-(3-methylphenyl)-1,1'-biphenyl-4,4' diamine), HMTPD (N,N,N',N'-tetrakis (3-methylphenyl)-1,1'-(3,3'-dimethyl) biphenyl-4,4'diamine), α-NPD(4,4'-bis[N-(1-naphthyl)-N-phenylamino]biphenyl) and m-MTDATA(4,4',4"-tris(3-methylphenyl phenylamino) triphenylamine), and carbazole derivatives. Specific examples thereof may include those with structures represented by formulae (T-1) to (T-8) below.

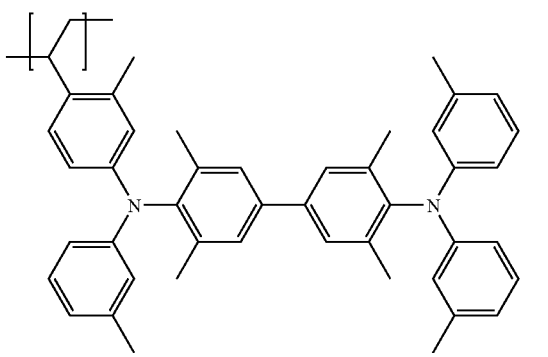

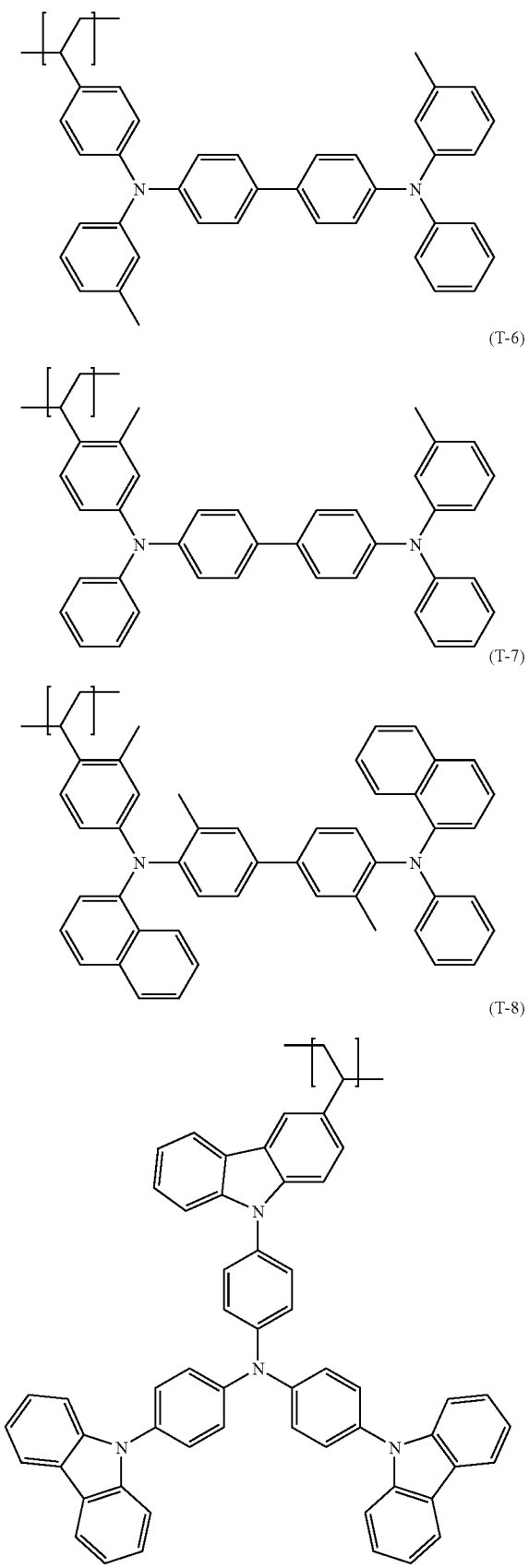

The hole-transporting monomer unit consists of a hole-transporting moiety, a moiety forming a polymer chain derived from carbon-carbon double bond and a linking group connecting these moieties.

The linking group in the hole transporting monomer unit is a part connecting the hole-transporting moiety with the polymer chain derived from carbon-carbon double bond. Examples of the linking group may include a single bond, —O—, —S—, —SO— or a divalent organic group having 1 to 20 carbon atoms which may have a hetero atom. Examples of the divalent organic group having 1 to 20 carbon atoms used for the linking group may include groups having structures represented by formulae (S-1) to (S-15) as shown above in the case of the linking group X in formula (2).

In the polymer compound of the present invention, when the number of times for repeating the hole-transporting monomer unit is v and the number of times for repeating the other monomer units (inclusive the monomer unit represented by formula (2)) is w (v and w each are an integer of 1 or more), the ratio of the number of times for repeating this third monomer unit against the total number of times for repeating all the monomer units, that is, v/(v+w) is preferably within a range of 0.001 to 0.99, more preferably 0.01 to 0.9.

The polymer compound of the present invention may further contain other monomer units. Examples thereof include electron-transporting units other than the unit represented by formula (2) and bipolar monomer units.

An electron-transporting unit may be introduced into the polymer compound through polymerization of a compound where a polymerizable functional group is incorporated, for example, in a quinolinol derivative metal complex such as trisaluminum quinolinol (Alq3), an oxadiazole derivative, a triazole derivative, an imidazole derivative, a triazine derivative or a triarylboron derivative.

The polymerization degree of the polymer compound of the present invention is preferably 5 to 10,000, more preferably 10 to 5,000.

The molecular weight of the polymer depends on the molecular weights and the polymerization degrees of the monomers constituting the polymer, so that it is difficult to absolutely determine the preferable molecular weight range of the polymer used in the present invention. Suffice it to say that the weight average molecular weight of the polymer of the present invention is preferably 1,000 to 2,000,000, more preferably 5,000 to 1,000,000, independently of the above polymerization degree.

Examples of methods for measuring the molecular weight include methods described in *Kobunshi Kagaku no Kiso*, Edited by The Society of Polymer Science, Japan, Tokyo Kagaku Dozin Co., Ltd., 1978, that is, gel permeation chromatography methods (GPC methods), osmotic pressure methods, light scattering methods, and ultracentrifugal methods.

FIG. 1 is a cross-sectional view showing an example of the structure of the organic light emitting device according to the present invention, and the structure is such that a hole transporting layer 3, a light emitting layer 4 and an electron transporting layer 5 are formed in this order between an anode 2 and a cathode 6 disposed on a transparent substrate 1. The structure of the organic light emitting device of the present invention is not limited to the example of FIG. 1, and may have, between an anode and a cathode, 1) a hole transporting layer and a light emitting layer or 2) a light emitting layer and an electron transporting layer, or only one layer of 3) a layer containing a hole transporting material, a light emitting material and an electron transporting material, 4) a layer containing a hole transporting material and a light emitting material, 5) a layer containing a light emitting material and an electron transporting material, and 6) a layer containing only a light emitting material. Further, the organic light emitting device may have two or more light emitting layers though the structure shown in FIG. 1 has one light emitting layer.

These layers between the cathode and the anode may be formed by known film-formation methods generally employed. In a case where a layer is formed through coating in a wet process, methods such as spin-coating, ink-jet, immersion and dipping may be employed, In the organic light emitting device of the present invention, the light emitting layer may be composed of the above-described light emitting polymer compound containing the boron-containing monomer unit represented by formula (2) and a light-emitting monomer unit or may be composed of a mixture prepared by mixing a light-emitting material consisting of a light-emitting compound (low-molecular weight or polymer compound), a hole-transporting material and an electron-transporting material with the boron-containing monomer unit represented by formula (2).

When a light-emitting material is mixed with the polymer compound of the present invention, the above-described compound having a light-emitting moiety may be used. In this case, the ratio of the light emitting material to the polymer compound of the present invention is within a range of 0.001 to 30 (wt) %, preferably 0.1 to 20 (wt) %.

Preferred examples of the light-emitting material include those having the following structures (D-12) to (D-21).

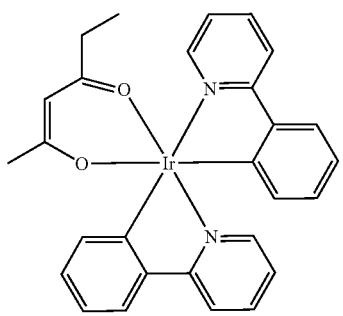

(D-12)

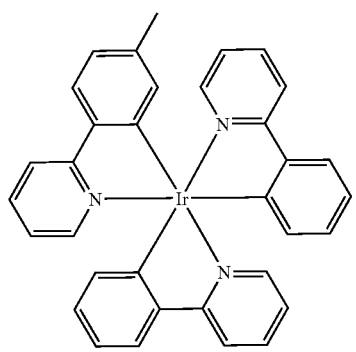

(D-13)

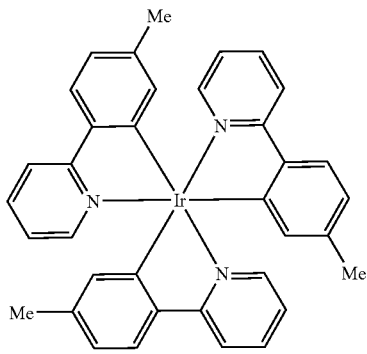

(D-14)

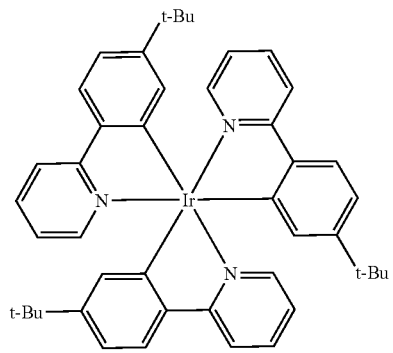

(D-15)

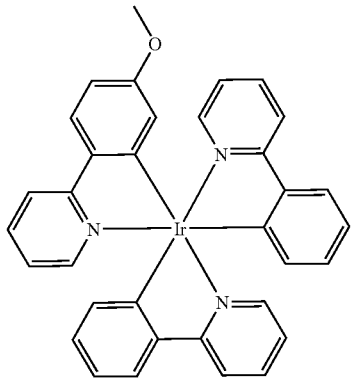

(D-16)

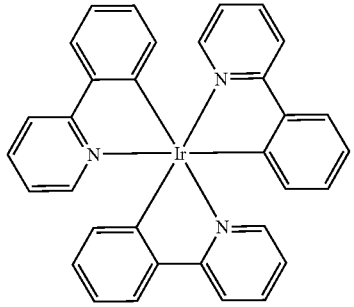

(D-17)

-continued

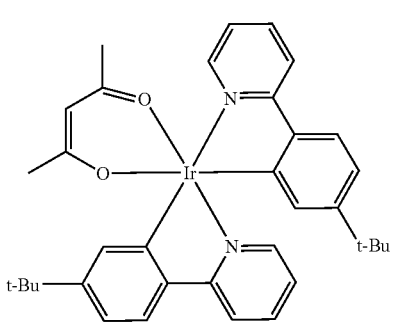
(D-18)

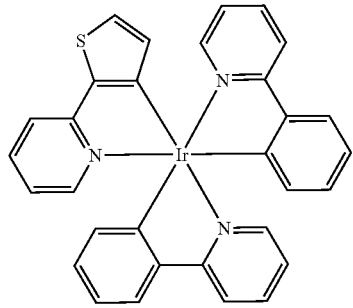
(D-19)

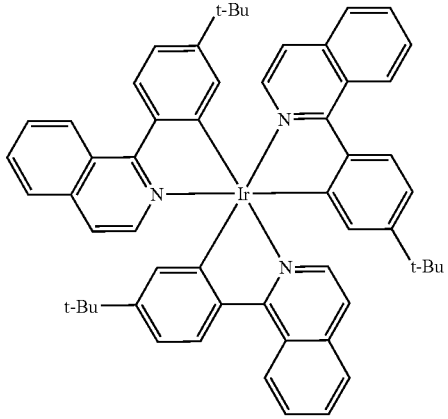
(D-20)

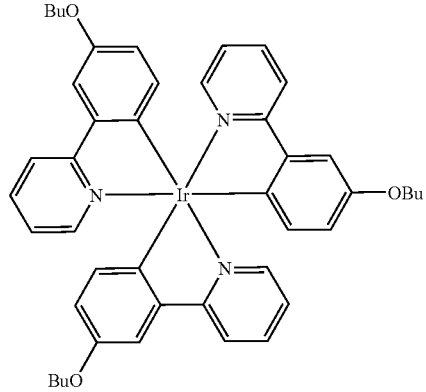
(D-21)

Moreover, for the purpose of supplementing hole-transporting property of the polymer compound of the present invention, a hole-transporting compound may be mixed in. Also, for the purpose of supplementing electron-transporting property, an electron-transporting compound may be mixed in. The carrier-transporting compound used herein may have a low molecular weight or a high molecular weight.

Examples of the hole transporting compound having a low molecular weight to be mixed into the polymer compound include triphenylamine derivatives such as N,N'-diphenyl-N, N'-(3-methylphenyl)-1,1'-biphenyl-4,4'-diamine (TPD), 4,4'-bis[N-(1-naphthyl)-N-phenylamino]biphenyl (α-NPD) and 4,4',4"-tris(3-methylphenylphenylamino)triphenylamine (m-MTDATA). Also, examples of the hole transporting compound having a high molecular weight to be mixed into the polymer compound include compounds polymerized by introducing a polymerizable functional group into a polyvinylcarbazol-based or triphenylamine-based low molecular weight compound, for example, the polymer compound having a triphenylamine structure disclosed in JP-A-8-157575.

On the other hand, examples of the electron transporting compound having a low molecular weight to be mixed into the polymer compound include quinolinol derivatives metal complex such as tris(aluminum) quinolinol (Alq3), oxadiazole derivatives, triazole derivatives, imidazole derivatives, triazine derivatives, and triarylboron derivatives. Also, examples of the electron transporting compound having a high molecular weight to be mixed into the polymer compound include compounds polymerized by introducing a polymerizable functional group into a low molecur weight compound as described above, for example, the poly(PBD) disclosed in JP-A-10-1665.

Further, for the purpose of improving the physical properties, etc. of the film formed of the polymer compound, a polymer compound having no direct effect on the light emitting properties of the polymer compound may be added and thus-obtained composition may be used as a light emitting material. For example, polymethyl methacrylate (PMMA) may be added to make the resultant film flexible.

In the organic light emitting device of the present invention, examples of the hole transporting material to form a hole-transporting layer include triphenylamine derivatives such as N,N'-dimethyl-N,N'-(3-methylphenyl)-1,1'-biphenyl-4,4'-diamine (TPD), 4,4'-bis[N-(1-naphthyl)-N-phenylamino]biphenyl (α-NPD) and 4,4',4"-tris (3-methylphenylphenylamino) triphenylamine (m-MTDATA) and polyvinylcarbazol. Also, a polymer compound prepared by introducing a polymerizable functional group into a triphenylamine-based low molecular weight compound, for example, the polymer compound having a triphenylamine structure disclosed in JP-A-8-157575, may be used. Further, polymer materials such as poly(paraphenylenevinylene) and polydialkylfluorene may also be used. These hole transporting materials may be used singly, or mixed or layered with other hole transporting materials. The thickness of the hole transporting layer is preferably 1 nm to 5 μm, more preferably 5 nm to 1 μm, further preferably 10 nm to 500 nm, though not particularly restricted.

In the organic light emitting device of the present invention, examples of the electron transporting materials to form the electron transporting layer include quinolinol derivative metal complexes such as tris (quinolinol) aluminum ($Alq_3$), oxadiazole derivatives, triazole derivatives, imidazole derivatives, triazine derivatives and triarylboron derivatives. Further, the electron transporting material may be a polymer produced by introducing a polymerizable functional group into the above-mentioned low molecular weight electron transporting compound, such as poly(PBD) disclosed in JP-A-10-1665. These electron transporting materials may be used singly, or mixed or layered with other electron transporting materials. The thickness of the electron transporting layer is preferably 1 nm to 5 μm, more preferably 5 nm to 1 μm, even more preferably 10 nm to 500 nm, though not particularly restricted.

Each of the light-emitting polymer compound used for the light emitting layer, the hole transporting material used for the hole transporting layer and the electron transporting material used for the electron transporting layer may singly form each layer, or may form the layer with a polymer material as a binder. Examples of the polymer material for the binder include polymethyl methacrylates, polycarbonates, polyesters, polysulfones and polyphenylene oxides.

The light emitting layer, the hole transporting layer, and the electron transporting layer can be formed by a resistance heating deposition method, an electron beam deposition method, a sputtering method, an ink-jet method, a spin coating method, a printing method, a spray method, a dispenser method, etc. In case of using a low molecular weight compounds to form a layer, dominantly employed are resistance heating deposition method and the electron beam deposition method, and in case of using a high molecular weight compound, dominantly employed are ink-jet method, the printing method, and the spin coating method.

For the purpose of efficiently recombining holes with electrons in the light emitting layer, a hole blocking layer may be disposed on the cathode side of the light emitting layer in order that holes can be prevented from passing through the light emitting layer. Examples of materials for the hole blocking layer include triazole derivatives, oxadiazole derivatives and phenanthroline derivatives.

The anode of the organic light emitting device of the present invention may comprise a known transparent conductive material, and examples of the materials include indium tin oxide (ITO), tin oxide, zinc oxide, and conductive polymers such as polythiophenes, polypyrroles and polyanilines. The electrode comprising the transparent conductive material preferably has a surface resistance of 1 to 50 Ω/square. The materials may be formed into a film by an electron beam deposition method, a sputtering method, a chemical reaction method, a coating method, etc. The anode preferably has a thickness of 50 to 300 nm.

An anode buffer layer may be disposed between the anode and the hole transporting layer or an organic layer adjacent to the anode to buffer the injection barrier for the holes. Copper phthalocyanine, a mixture of polyethylene dioxythiophene (PEDOT) and polystyrene sulfonate (PPS), etc. can be used for the buffer layer. An appropriate intermediate layer may be formed on the anode material. Such an intermediate layer can be formed as an organic thin film by treating a gaseous organic compound with high-frequency (RF) plasma process.

In the organic light emitting device of the present invention, it is preferable that a material having a small work function, for example, alkaline metals such as Li and K and alkaline earth metals such as Mg, Ca, and Ba be used as cathode material, from the viewpoint of the electron injection efficiency. It is also preferable that as materials chemically more stable than the above materials, Al, an Mg—Ag alloy, an Al-alkaline metal alloy such as an Al—Li alloy and an Al—Ca alloy, etc., be used as cathode material. To achieve both of the electron injection efficiency and the chemical stability, a thin layer of an alkaline or alkaline earth metal such as Cs, Ca, Sr, and Ba having a thickness of approximately 0.01 to 10 μm may be disposed below the Al layer (assuming that the cathode is on the upper side while the anode on the lower side), as described in JP-A-2-15595 and JP-A-5-121172. The cathode can be formed from the material by a resistance heating deposition method, an electron beam deposition method, a sputtering method, an ion plating method, etc. The thickness of the cathode is preferably 10 nm to 1 μm, more preferably 50 to 500 nm.

In the organic light emitting device of the present invention, the substrate may be an insulating substrate transparent against the emission wavelength of the light emitting material. Glasses and transparent plastics including polyethylene terephthalate (PET), polycarbonate, and polymethyl methacrylate (PMMA) can be used for the substrate.

The light-emitting device according to the present invention can be used in a display unit, illumination, a backlight for a display unit, an interior or exterior accessory, and a light source for surface emission.

BEST MODE FOR CARRYING OUT THE INVENTION

Figure 1:
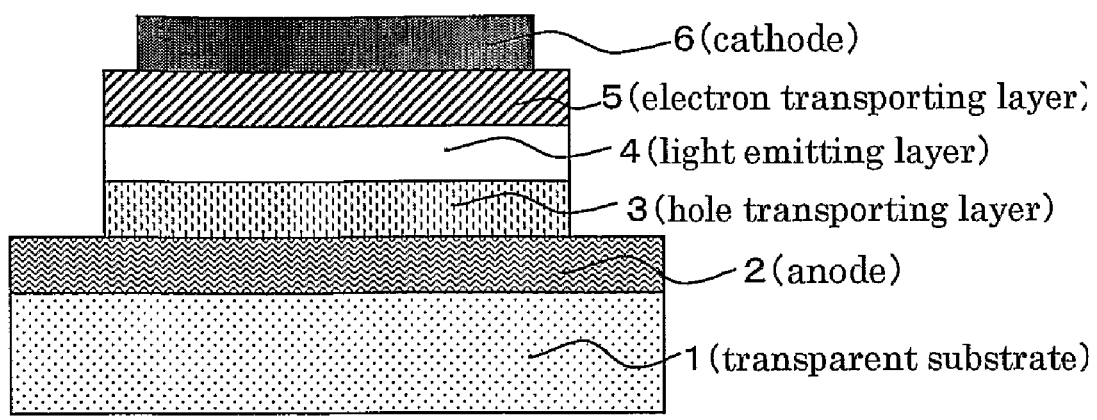
FIG. 1 is a sectional view of one embodiment of an organic light-emitting device according to the present invention.

The present invention will be explained in more detail below referring to typical examples. The examples are considered in all respects to be illustrative, and the present invention is not restricted thereto.

<Measuring Apparatuses>
1) $^1$H-NMR and $^{13}$C-NMR
  JNM EX270 manufactured by JEOL Ltd.
  270 Mz
  Solvent: Chloroform-d
2) GPC measurement (molecular weight measurement)
  Column: Shodex KF-G+KF804L+KF802+KF801
  Eluent: Tetrahydrofuran (THF)
  Temperature: 40° C.
  Detector: RI (Shodex RI-71)
3) ICP elemental analysis
  ICPS 8000 manufactured by Shimadzu Corporation

EXAMPLE 1

Synthesis of Polymerizable Compound (Boron Monomer Compound 1)

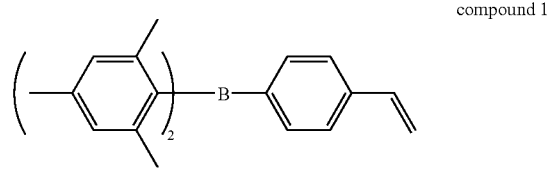

compound 1

(1) Preparation of Grignard Reagent

Under a nitrogen atmosphere, to a 100 ml-volume four-neck flask, 1.00 g of magnesium, 5 ml of dry tetrahydrofuran (THF) and 2 mg of iodine were charged and stirred at room temperature until there is no iodic color. Thereto was added a solution prepared by dissolving 7.30 g of 4-bromostyrene in 30 ml of dry tetrahydrofuran (THF) dropwise to be a reaction temperature of 15 to 20° C. in a dry-ice/methanol bath. After dropping, the reaction solution was stirred for 60 minutes while keeping the temperature of 15 to 20° C. to prepare a Grignard reagent (StyMgBr).

(2) Synthesis of Triarylboron

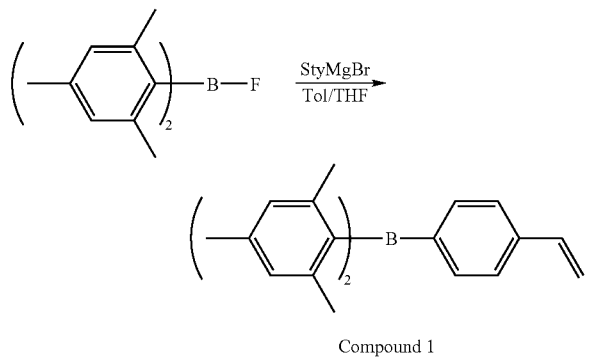

Compound 1 under a nitrogen atmosphere, to a 200 ml-volume four-neck flask, 4.16 g of dimesitylboronfluoride and 10 ml of toluene (Tol) were charged. Thereto was added the Grignard reagent (StyMgBr) prepared above to be a temperature of 15 to 20° C., and then stirred for 6 hours while keeping the temperature of 15 to 20° C.

Then, 80 ml of 0.5 N hydrochloric acid and 100 ml of ethyl acetate were added to the reaction solution to subject to extraction. The organic layer was washed with water and saturated saline and dried over anhydrous sodium sulfate. After the drying agent was filtered out and the solvent was distilled off, the remaining crude crystal was recrystallized from ethanol to obtain 3.64 g of Compound 1 with a yield of 70%.

$^1$H-NMR(270 MHz,CDCl$_3$),ppm:2.01(s,12H,Ar—CH$_3$), 2.30(s,6H,Ar—CH$_3$),5.30-5.33(d,1H,—CH=CH$_2$), 5.82-5.87(d,1H,—CH=CH$_2$), 6.60-6.82(m,5H, aromatic,—CH=CH$_2$),7.36-7.49(m, 4H,aromatic).

EXAMPLE 2

Synthesis of Polymerizable Compound (Boron Monomer Compound 2)

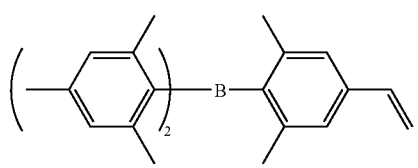

compound 2

(1) Synthesis of 1-bromo-2,6-dimethyl-4-tert-buthyldimethylsiloxybenzene (Compound 3)

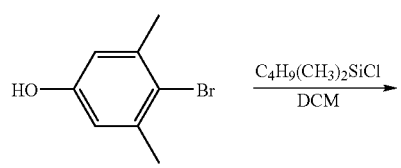

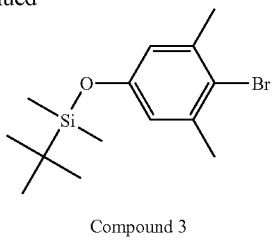

Compound 3

Under a nitrogen atmosphere, to a 100 ml-volume three-neck flask, 5.00 g of 4-bromo-3,5-dimethylphenol, 3.87 g of tert-buthyl dimethylchlorosilane, 10 ml of dry dichloromethane (DCM) and 3 ml of dry dimethylformamide (DMF) were charged and stirred. While stirring, thereto was added a solution prepared by dissolving 1.75 g of imidazole in 10 ml of dry DCM dropwise. After dropping, the reaction solution was stirred for 3 hours at room temperature. Then, the generated impurities were separated by filtration and the filtrate was concentrated under a reduced pressure, and ethyl acetate and 5% aqueous sodium hydrogencarbonate solution were added thereto. The organic layer was separated and washed with water and saturated saline and dried over anhydrous sodium sulfate. After the drying agent was filtered out and the solvent was distilled off, the residue was purified by a silica gel column chromatography to obtain 7.45 g of the desired product with a yield of 95%.

(2) Preparation of Grignard Reagent

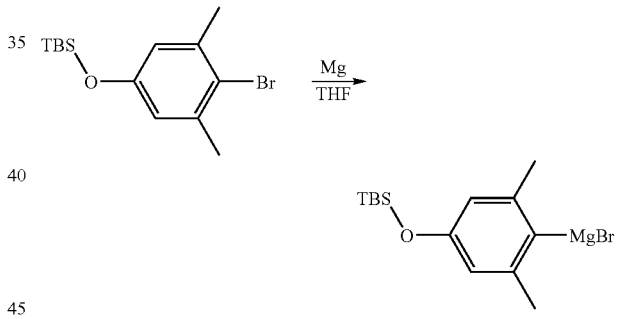

Under a nitrogen atmosphere, to a 100 ml-volume four-neck flask, 0.60 g of magnesium, 5 ml of dry tetrahydrofuran (THF) and 2 mg of iodine were charged and stirred at room temperature until there is no iodic color. Added thereto was a solution prepared by dissolving 7.25 g of 1-bromo-2,6-dimethyl-4-tert-buthyldimethylsiloxybenzene in 30 ml of dry THF dropwise to be a reaction temperature of 67 to 70° C. After dropping, the reaction solution was stirred for 60 minutes while keeping the temperature of 67 to 70° C. to prepare a Grignard reagent (OTBSXyMgBr).

(3) Synthesis of dimesityl(4-tert-buthyldimethylsiloxy-2,6-dimethylphenyl)borane (Compound 4)

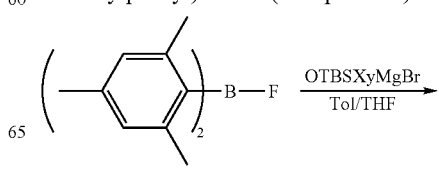

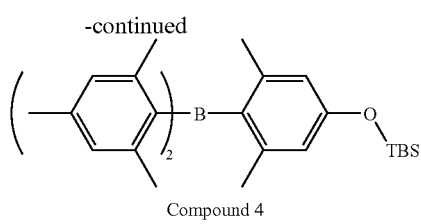

Compound 4

Under a nitrogen atmosphere, to a 200 ml-volume four-neck flask, 3.32 g of dimesitylboronfluoride and 10 ml of dry toluene (Tol) were charged. Thereto was added the Grignard reagent (OTBSXyMgBr) prepared above, and then stirred for 6 hours at oil temperature of 130° C. After standing to cool, 80 ml of 0.5 N hydrochloric acid and 120 ml of ethyl acetate were added to the reaction solution to separate the organic layer. Then, the organic layer was washed with water and saturated saline and dried over anhydrous sodium sulfate. After the drying agent was filtered out and the solvent was distilled off, the remained crude crystal was purified by a silica gel column chromatography to obtain 4.75 g of Compound 4 with a yield of 88%.

$^1$H-NMR(270 MHz,CDCl$_3$),ppm:0.18-0.19(d,6H,SiCH$_3$), 0.97-0.98(t,9H,C(CH$_3$)$_3$),1.94-1.97(m,12H,ArCH$_3$),2.25-2.26(d,6H,ArCH$_3$),6.42-6.73(m,6H,aromatic).

(4) Synthesis of dimesityl(4-hydroxy-2,6-dimethylphenyl) borane (Compound 5)

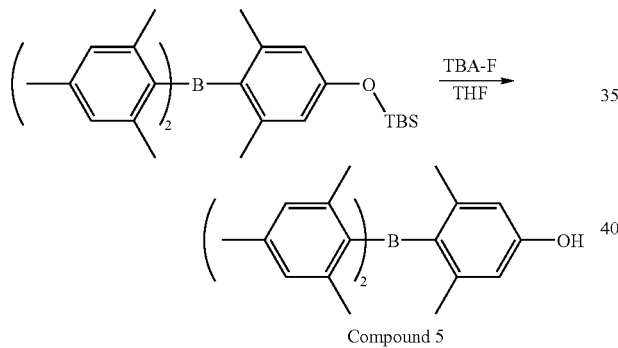

Compound 5

Under a nitrogen atmosphere, to a 200 ml-volume four-neck flask, 4.50 g of Compound 4 and 15 ml of dry tetrahydrofuran (THF) were charged. While stirring, thereto was added a 8.8 g of tetranormalbutylammoniumfluoride trihydrate (TBA-F). After stirred for 30 minutes, thereto was added 20 ml of 5% aqueous citric acid solution and stirred for another 10 minutes. The generated solid were separated by filtration, and then ethyl acetate was added to the filtrate to subject to extraction. The organic layer was washed with water and saturated saline and dried over anhydrous sodium sulfate. After the drying agent was filtered out and the solvent was distilled off, the obtained residue and the above separated solid was mixed together and recrystallized from ethanol to obtain 2.93 g of Compound 5. The filtrate was purified by a silica gel column chromatography to obtain 0.32 g of Compound 5. As a result, 3.25 g of Compound 5 was obtained collectively with a yield of 94%.

$^1$H-NMR(270 MHz,CDCl$_3$),ppm:1.95-1.98(m,12H, ArCH$_3$),2.26(s,6H,ArCH$_3$),5.4(s,1H,Ar—OH),6.41(s,2H, aromatic),6.73(s,4H,aromatic).

(5) Synthesis of Compound 6

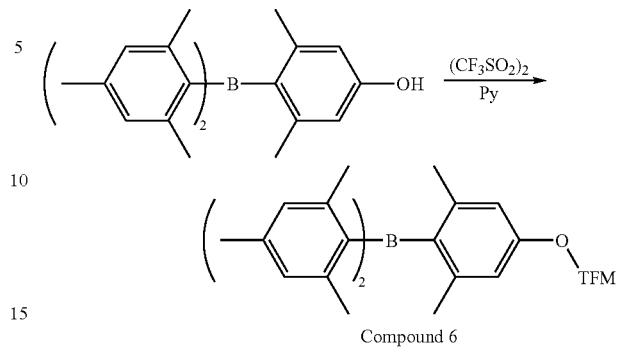

Compound 6

To a 100 ml-volume eggplant type flask, 2.81 g of Compound 5 and 10 ml of dry pyridine .(Py) were charged. Thereto was added 1.4 ml of anhydrous trifluoromethanesulfonic acid under ice temperature. The solution was stirred for 10 minutes still at ice temperature. After that, the solution was stirred overnight at room temperature and then transferred to a 200 ml-volume conical beaker containing ice. Then, the liquid was extracted with ethyl acetate. The organic layer was washed with water and saturated saline and dried over anhydrous sodium sulfate. After the drying agent was filtered out and the solvent was distilled off, the obtained residue was purified by a silica gel column chromatography to obtain 3.37 g of the desired product with a yield of 99%.

(6) Synthesis of dimesityl(4-vinyl-2,6-dimethylphenyl)borane (Compound 2)

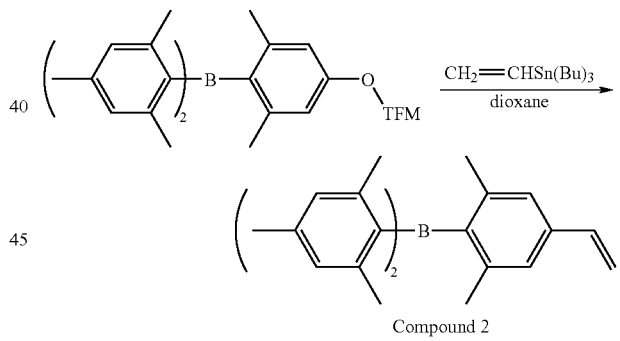

Compound 2

To a 100 ml-volume eggplant type flask, 2.95 g of Compound 6 and 15 ml of dry dioxane, 2.20 g of tributyl vinyl tin, 0.85 g of anhydrous lithium chloride, 0.15 g of tetrakis(triphenylphosphine)palladium and 0.05 g of 2,6-di-tert-butyl-4-methyl-phenol were charged and stirred for 3 hours at hot water temperature of 100° C. After standing to cool, thereto was added 3.5 ml of pyridine and 7 ml of 1.4M pyridinium fluoride tetrahydrofuran (THF) solution and stirred overnight at room temperature. After that, 10 ml of ethyl acetate was added to the reaction solution and the generated insoluble matters were separated by filtration. The filtrate was washed with water, 4N hydrochloric acid, water, 4N sodium hydroxide, water and saturated saline in this order and dried over anhydrous sodium sulfate. After the drying agent was filtered out and the solvent was distilled off, the obtained residue was purified by a silica gel column chromatography to obtain 1.30 g of the desired product with a yield of 51%.

$^1$H-NMR(270 MHz,CDCl$_3$),ppm:1.98-2.01(m,18H, ArCH$_3$),2.26(s, 6H,ArCH$_3$),5.19-5.23(dd,1H,—CH═CH$_2$), 5.73-5.80(dd,1H,—CH═CH$_2$),6.58-6.69(dd, 1H,—CH═CH$_2$),6.73(s,4H,aromatic),6.96(s,2H,aromatic).

EXAMPLE 3

Synthesis of Polymerizable Compound (Boron Monomer Compound 7)

Compound 7

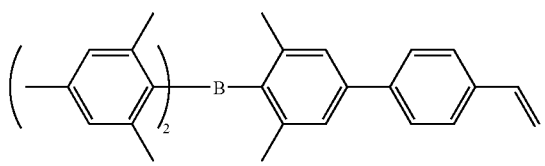

(1) Synthesis of dimesityl(4-styryl-2,6-dimethylphenyl)borane (Compound 7)

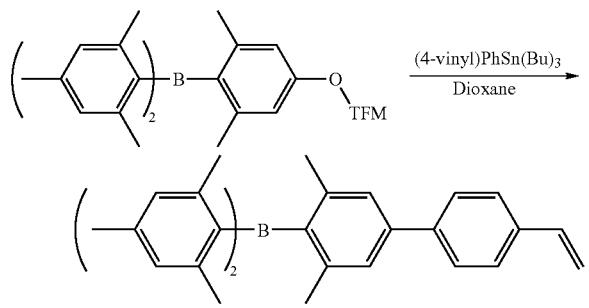

To a 100 ml-volume eggplant type flask, 2.22 g of Compound 6 and 12 ml of dry dioxane, 1.66 g of tributyl vinyl tin, 0.64 g of anhydrous lithium chloride, 0.11 g of tetrakis(triphenylphosphine)palladium and 0.03 g of 2,6-di-tert-butyl-4-methyl-phenol were charged and stirred for 3 hours at hot water temperature of 100° C. After standing to cool, thereto was added 2.7 ml of pyridine and 3.2 ml of 1.4M pyridinium fluoride tetrahydrofuran (THF) solution and stirred overnight at room temperature. After that, 10 ml of ethyl acetate was added to the reaction solution and the insoluble matters were separated by filtration. The filtrate was washed with water, 4N hydrochloric acid, water, 4N sodium hydroxide, water and saturated saline in this order and dried over anhydrous sodium sulfate. After the drying agent was filtered out and the solvent was distilled off, the obtained residue was purified by a silica gel column chromatography to obtain 1.14 g of the desired product with a yield of 50%.

$^1$H-NMR(270 MHz,CDCl$_3$),ppm:1.98-2.01(m,18H, ArCH$_3$),2.26(s,6H,ArCH$_3$),5.21-5.27(dd,1H,—CH═CH$_2$), 5.75-5.81(dd,1H,—CH═CH$_2$),6.72-6.88(m,5H,—CH═CH$_2$,ArH),7.20(s,2H,aromatic),7.41-7.66(m,4H,aromatic).

EXAMPLE 4

Synthesis of Polymerizable Compound (Boron monomer Compound 8)

Compound 8

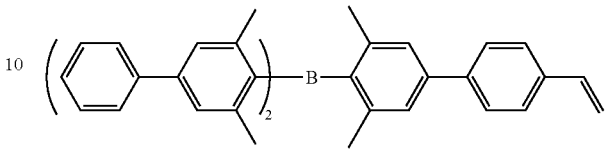

(1) Synthesis of 4-bromo-3,5-dimethylanisole(Compound 9)

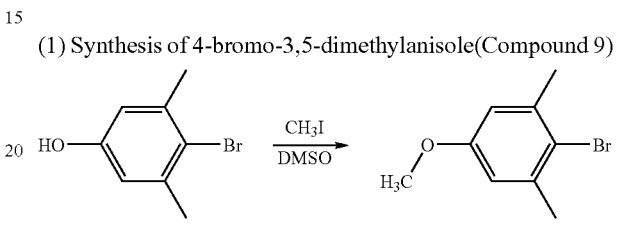

Into a 200 ml-volume four-neck flask, 10.0 g of 4-bromo-3,5-dimethylphenol, 10 ml of dry dimethylsulfoxide and 11.2 g of tert-butoxy potassium were charged and stirred at room temperature. Thereto was added 8.5 g of methyl iodide while stirring and the resultant mixture was further stirred for 2 hours. To the reaction mixture, 200 ml of ethyl acetate and 50 ml of water were added, and an organic layer was extracted. The organic layer was washed with water, 5% aqueous sodium hydroxide solution, water, and saturated saline in this order, and then dried over anhydrous sodium sulfate. After filtering out the drying agent, solvent was removed and the residue was purified by silica gel column chromatography to thereby obtain 10.36 g of the target compound (yield 97%).

(2) Preparation of Grignard Reagent

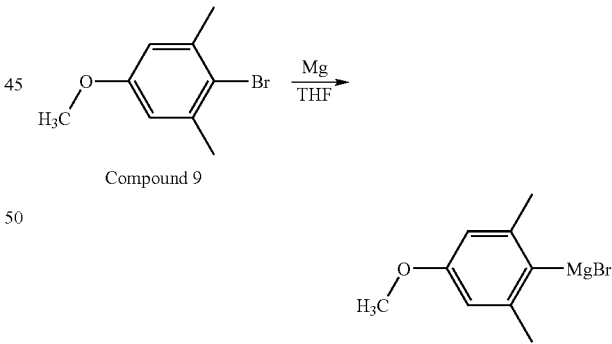

Under a nitrogen atmosphere, into a 100 ml-volume four-neck flask, 1.2 g of magnesium, 5 ml of dry tetrahydrofuran (THF) and 2 mg of iodine were charged and stirred at room temperature until there the iodic color disappeared. Thereto was added dropwise a solution prepared by dissolving 10.3 g of 4-bromo-3,5-dimethyl-anisole in 30 ml of dry THF so that the reaction temperature became 67 to 70° C. After dropping, the reaction solution was stirred for 60 minutes with the temperature kept unchanged to thereby prepare a Grignard reagent.

(3) Synthesis of Compound 10

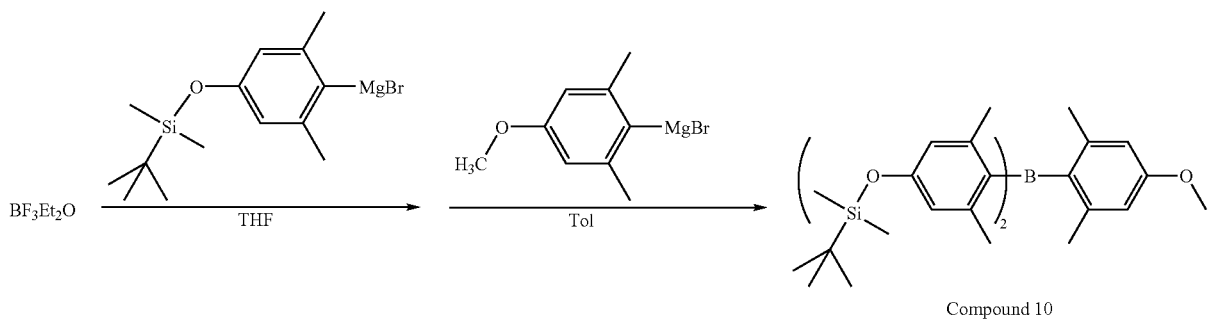

Compound 10

Under a nitrogen atmosphere, into a 200 ml-volume four-neck flask, 3.4 g of borontrifluoride ether complex and 10 ml of dry THF were charged. Thereto was added the Grignard reagent (OTBSXyMgBr) prepared above and then stirred for 3 hours at an oil temperature of 70° C. To this reaction solution, the Grignard reagent prepared from Compound 9 was added, and the mixture was stirred for 6 hours at an oil temperature of 130° C. After left standing to be cooled, water of 100 ml in total was added little by little to the solution, and then 20 ml of 10% hydrochloric acid was added thereto. Subsequently, 200 ml of ethyl acetate was added thereto to extract an organic layer. The organic layer was washed with water, saturated saline and water in this order, and then dried over anhydrous sodium sulfate. The drying agent was filtered out and the solvent was removed. The residue was purified by silica gel column chromatography and through recrystalization to thereby obtain 7.4 g of the target compound (yield 50%).

(4) Synthesis of Compound 11

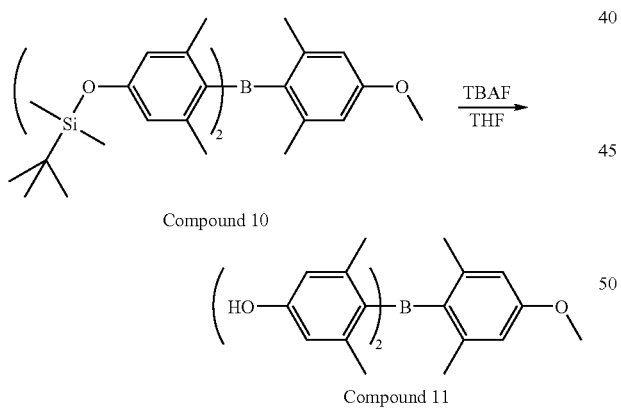

Compound 10

Compound 11

Under a nitrogen atmosphere, into a 200 ml-volume four-neck flask, 6.8 g of Compound 10 and 30 ml of dry THF were charged. Thereto was added 18 g of tetra-n-butyl ammonium fluoride trihydrate (TBAF) while stirring. After 30 minutes, 80 ml of 5% aqueous citric acid solution was added thereto and the mixture was further stirred for 10 minutes. Then, solid precipitated therein was filtered out. To the resultant filtrate liquid, ethyl acetate was added and an organic layer was extracted. The organic layer was washed with water and saturated saline, and then dried over anhydrous sodium sulfate. The drying agent was filtered out and the solvent was removed. The residue and the solid were mixed and recrystallized with ethanol to thereby obtain 4.3 g of the target compound 11 (yield 99%).

(5) Synthesis of Compound 12

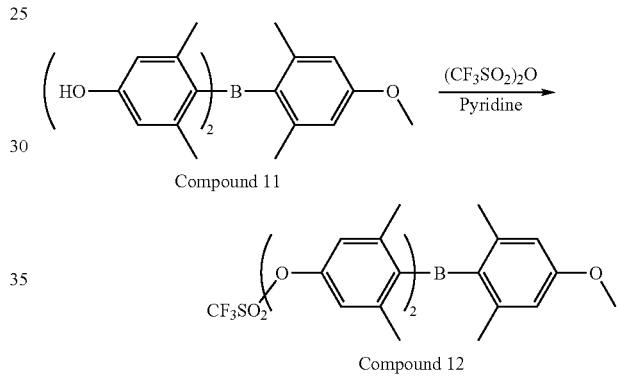

Compound 11

Compound 12

Into a 100 ml-volume eggplant type flask, 4.2 g of Compound 11 and 20 ml of dry pyridine (py) were charged. Thereto was added 4 ml of anhydrous trifluoromethane sulfonate at the ice temperature. After the resultant mixture was stirred for 10 minutes at the ice temperature and further stirred overnight at room temperature, the mixture was transferred into a 200 ml-volume conical beaker which contained ice therein. Ethyl acetate was added thereto to extract an organic layer. The organic layer was washed with water and saturated saline, and then dried over anhydrous sodium sulfate. After filtering out the drying agent, solvent was removed and the residue was purified by silica gel column chromatography to thereby obtain 6.6 g of the target compound (yield 93%).

(6) Synthesis of Compound 13

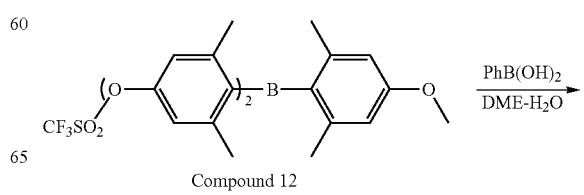

Compound 12

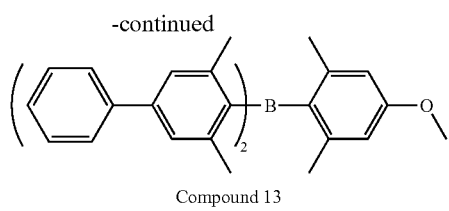

Compound 13

Under a nitrogen atmosphere, into a 200 ml-volume four-neck flask, 3.2 g of Compound 12, 10 ml of dimethoxyethane (DME), 1.3 g of phenyl boric acid, 2.0 g of potassium carbonate and 2.0 ml of water were charged and the mixture was stirred for 1 hour under reflux while heating. Thereto was added 220 mg of tetrakis (triphenylphosphine) palladium, and the mixture was stirred for 3 hours under reflux while heating. After left standing to be cooled, 20 ml of ethyl acetate was added thereto and sufficiently stirred. Subsequently, the resultant solution was subjected to Celite filtration and the filtrate liquid was transferred into a separatory funnel. An organic layer was separated and washed with water and saturated saline, and then dried over anhydrous sodium sulfate. After filtering out the drying agent, solvent was removed and the residue was purified by silica gel column chromatography to thereby obtain 2.0 g of Compound 13 (yield 83%)

(7) Synthesis of Compound 14

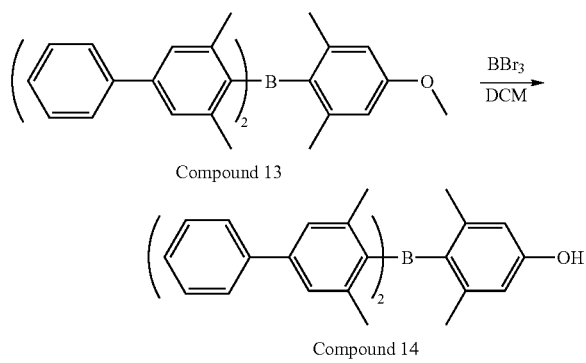

Compound 13

Compound 14

Into a 200 ml-volume eggplant type flask, 2.0 g of Compound 13 and 20 ml of dry dichloromethane(DCM) were charged. Thereto was added 5 ml of 1M solution of boron tribromide in dichlororomethane at −78° C. and stirred for 10 minutes at the same temperature, and stirring was further performed at room temperature overnight. Water was added to the resultant mixture to extract an organic layer. The organic layer was washed with water and saturated saline, and then dried over anhydrous sodium sulfate. After filtering out the drying agent, solvent was removed and the residue was purified by silica gel column chromatography to thereby obtain 1.8 g of the target compound (yield 93%).

(8) Synthesis of Compound 15

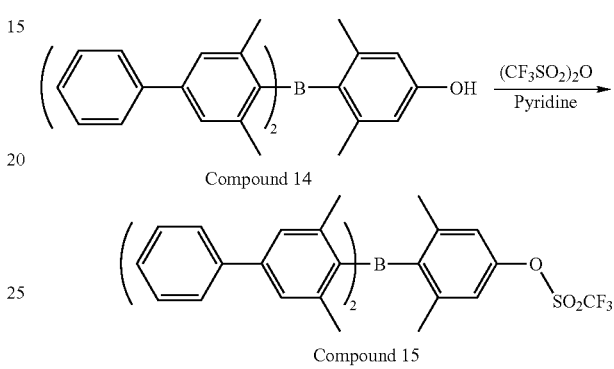

Compound 14

Compound 15

Into a 100 ml-volume eggplant type flask, 1.7 g of Compound 14 and 10 ml of dry pyridine (py) were charged. Thereto was added 0.7 ml of anhydrous trifluoromethane sulfonate at the ice temperature. After the resultant mixture was stirred for 10 minutes at the ice temperature and further stirred overnight at room temperature, the mixture was transferred into a 200 ml-volume conical beaker which contained ice therein. Ethyl acetate was added thereto to extract an organic layer. The organic layer was washed with water and saturated saline, and then dried over anhydrous sodium sulfate. After filtering out the drying agent, solvent was removed and the residue was purified by silica gel column chromatography to thereby obtain 2.1 g of the target compound (yield 99%).

(9) Synthesis of Compound 8

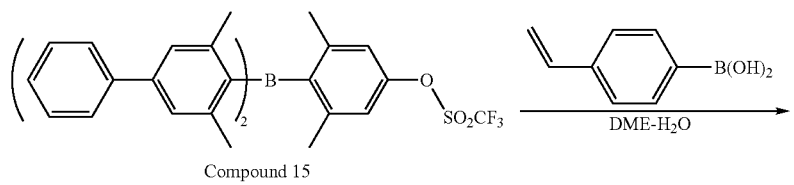

Compound 15

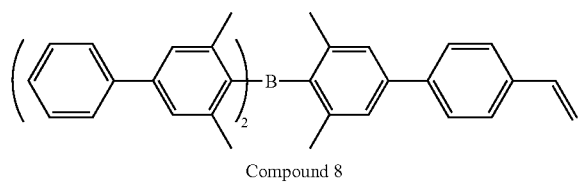

Compound 8

Under a nitrogen atmosphere, into a 100 ml-volume four-neck flask, 2.0 g of Compound 15, 10 ml of dimethoxyethane (DME), 0.52 g of 4-vinylphenyl boric acid, 1.3 g of potassium carbonate, 2 mg of 2,6-di-tert-butyl-4-methyl phenol, 75 mg of triphenylphosphine and 2.0 ml of water were charged and the mixture was stirred for 30 minutes under reflux while heating. Thereto was added 75 mg of tetrakis (triphenylphosphine) palladium, and the mixture was stirred for 1 hour under reflux while heating. After left standing to be cooled, 20 ml of ethyl acetate was added thereto and sufficiently stirred. Subsequently, the resultant solution was subjected to Celite filtration and the filtrate liquid was transferred into a separatory funnel. An organic layer was separated and washed with water and saturated saline, and then dried over anhydrous sodium sulfate. After filtering out the drying agent, solvent was removed and the residue was purified by silica gel column chromatography to thereby obtain 1.2 g of compound 8 (yield 66%)

$^1$H-NMR(270 MHz,CDCl$_3$),ppm:2.15(s,18H,ArCH$_3$), 5.21-5.27(dd,1H,—CH=CH$_2$),5.75-5.81(dd,1H,—CH=CH$_2$),6.68-6.85(q,1H,—CH=CH$_2$,),7.20-7.68(m,20 H, aromatic)

EXAMPLE 5

Synthesis of Polymerizable Compound (Compound 16)

Compound 16

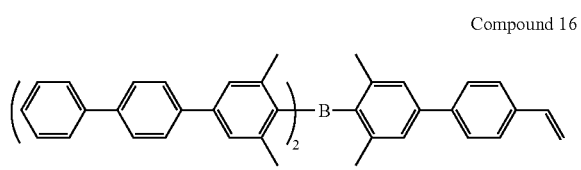

(1) Synthesis of Compound 17

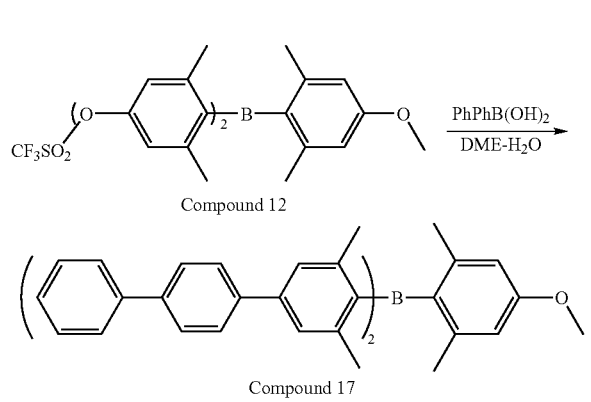

Under a nitrogen atmosphere, into a 200 ml-volume four-neck flask, 3.4 g of Compound 12, 15 ml of dimethoxyethane (DME), 2.2 g of biphenyl boric acid, 2.1 g of potassium carbonate, 150 mg of triphenylphosphine and 2.0 ml of water were charged and the mixture was stirred for 1 hour under reflux while heating. Thereto was added 180 mg of tetrakis (triphenylphosphine) palladium, and the mixture was stirred for 3 hours under reflux while heating. After left standing to be cooled, 20 ml of ethyl acetate was added thereto and sufficiently stirred. Subsequently, the resultant solution was subjected to Celite filtration and the filtrate liquid was transferred into a separatory funnel. An organic layer was separated and washed with water and saturated saline, and then dried over anhydrous sodium sulfate. After filtering out the drying agent, solvent was removed and the residue was purified by silica gel column chromatography to thereby obtain 2.6 g of the target compound 17 (yield 76%)

(2) Synthesis of Compound 18

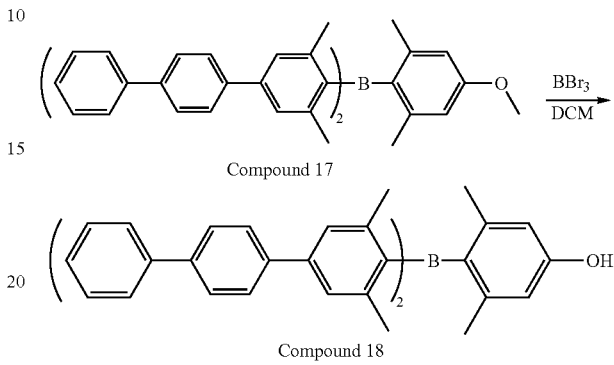

Into a 200 ml-volume eggplant type flask, 2.5 g of Compound 17 and 10 ml of dry dichloromethane (DCM) were charged. Thereto was added 4 ml of 1M solution of boron tribromide in dichloromethane at −78° C. and stirred for 10 minutes at the same temperature, and stirring was further performed at room temperature overnight. Water was added to the reaction solution to extract an organic layer. The organic layer was washed with water and saturated saline, and then dried over anhydrous sodium sulfate. After filtering out the drying agent, solvent was removed and the residue was purified by silica gel column chromatography to thereby obtain 2.4 g of the target compound (yield 98%).

(3) Synthesis of Compound 19

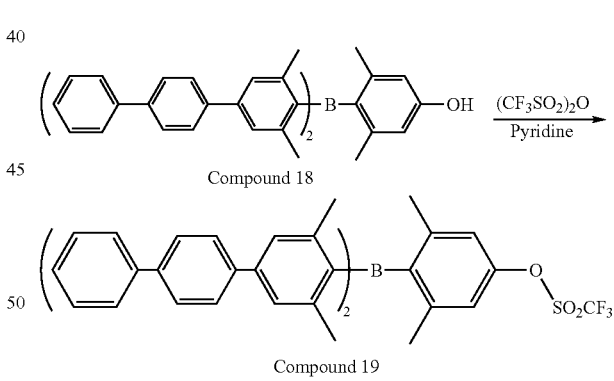

Into a 100 ml-volume eggplant type flask, 2.3 g of Compound 18 and 10 ml of dry pyridine (py) were charged. Thereto was added 0.7 ml of anhydrous trifluoromethane sulfonate at the ice temperature. The resultant mixture was stirred for 10 minutes at the ice temperature and further stirred overnight at room temperature, and then transferred into a 200 ml-volume conical beaker which contained ice therein. Ethyl acetate was added thereto to extract an organic layer. The organic layer was washed with water and saturated saline, and then dried over anhydrous sodium sulfate. After filtering out the drying agent, solvent was removed and the residue was purified by silica gel column chromatography to thereby obtain 2.6 g of the target compound (yield 93%).

(4) Synthesis of Compound 16

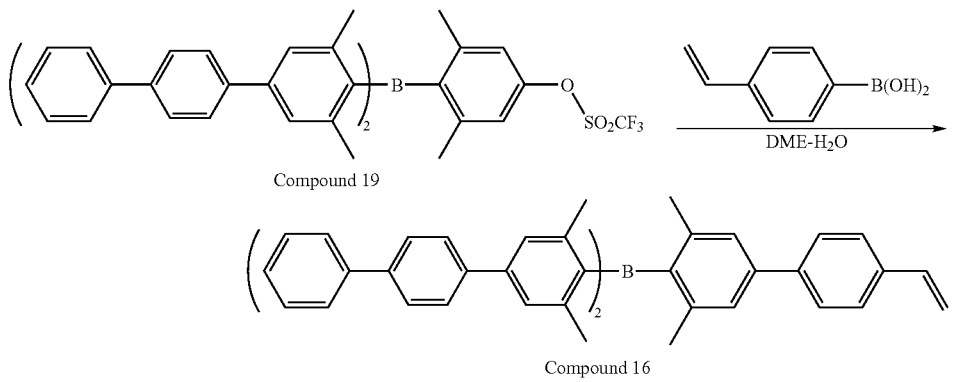

Compound 19

Compound 16

Under a nitrogen atmosphere, to a 100 ml-volume four-neck flask, 1.2 g of Compound 19, 8 ml of dimethoxyethane (DME), 0.24 g of 4-vinylphenyl boric acid, 0.61 g of potassium carbonate, 2 mg of 2,6-di-tert-butyl-4-methyl-phenol, 50 mg of triphenylphosphine and 1.0 ml of water were charged and the mixture was stirred for 30 minutes under reflux while heating. Thereto was added 50 mg of tetrakis (triphenylphosphine) palladium, and the mixture was stirred for 1 hour under reflux while heating. After left standing to be cooled, 20 ml of ethyl acetate was added thereto and sufficiently stirred. Subsequently, the resultant solution was subjected to Celite filtration and the filtrate liquid was transferred into a separatory funnel. An organic layer was separated and washed with water and saturated saline, and then dried over anhydrous sodium sulfate. After filtering out the drying agent, solvent was removed and the residue was purified by silica gel column chromatography to thereby obtain 0.79 g of Compound 16 (yield 73%)

$^1$H-NMR(270 MHz,CDCl$_3$),ppm:2.19(s,18H,ArCH$_3$), 5.26-5.29(dd,1H,—CH=CH$_2$),5.77-5.82(dd,1H,—CH=CH$_2$),6.68-6.85(q,1H,—CH=CH$_2$,),7.20-7.81(m,28 H,aromatic)

EXAMPLE 6

Synthesis of Polymerizable Compound (viHMTPD) (Compound 20)

Compound 20

(1) Tetratolylation of ortho tolidine

Under an nitrogen atmosphere, to a 200 ml-volume three-neck flask, 5.00 g of orthotolidine, 22.60 g of 3-iodotoluene and 100 ml of dry xylene were added and heated to about 50° C. while stirring. Thereto was added 13.64 g of potassium tert-butoxide, 0.46 g of palladium acetate, and 0.46 g of tri-tert-butylphosphine in this order, and the resulting mixture was stirred for 4 hours at 120° C. The reaction liquid was cooled to the room temperature and added 100 ml of water, and then the liquid was extracted with ethylacetate2 times. The organic layer was dried over magnesium sulfate, concentrated under a reduced pressure, and purified by a silica gel column chromatography using a developing solvent of an ethyl acetate-hexane mixed solvent. After the solvent was distilled off, the obtained residue was recrystallized from methanol to obtain 11.46 g of 3,3'-dimethyl-N,N,N',N'-tetra-m-tolylbenzidine (Compound 21) with a yield of 85%.

(2) Synthesis of Compound 22

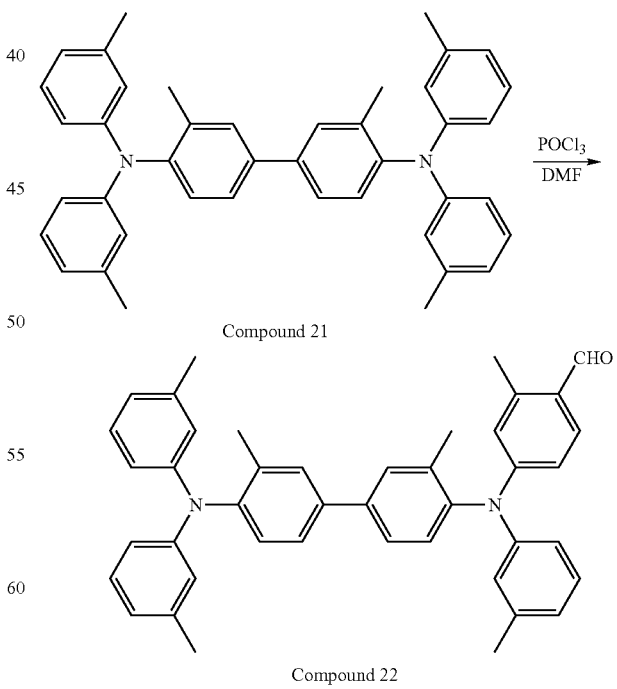

Compound 21

Compound 22

Under a nitrogen atmosphere, 1 ml of phosphorus oxychloride was added to 4 ml of dry dimethylformamide (DMF)

under ice temperature and stirred for 30 minutes at room temperature to prepare the Vilsmeier reagent.

Under a nitrogen atmosphere, to a 100 ml-volume four-neck flask, 5.25 g of Compound 21 and 25 ml of dry DMF were charged and stirred at 80° C. The above prepared Vilsmeier reagent was added dropwise to the reaction liquid and the solution was stirred for another hour at 80° C. After standing to cool, the reaction solution was transferred to a 500 ml-volume beaker placed 8 g of sodium hydrogen carbonate and 50 ml of water therein and added 150 ml of ethyl acetate. The organic layer was separated and washed with water and saturated saline in order and dried over anhydrous sodium sulfate. After the drying agent was filtered out and the solvent was distilled off, the obtained residue was purified by a silica gel column chromatography to obtain 2.55 g of the desired product with a yield of 46%.

(3) Synthesis of Compound 20

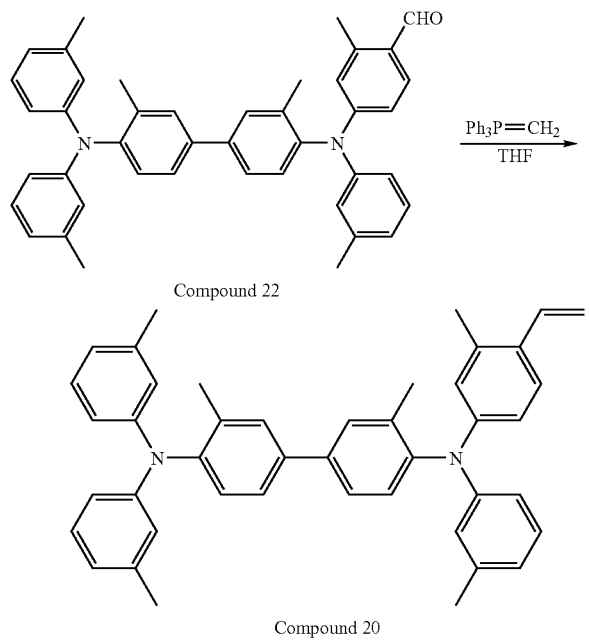

Under a nitrogen atmosphere, to a 100 ml-volume four-neck flask, 1.93 g of methyltriphenylphosphonium bromide and 10 ml of dry tetrahydrofuran (THF) were charged and stirred under ice temperature. Thereto was added 3.2 ml of a 1.58 M normal butyl lithium hexane solution over 10 minutes and stirred for 10 minutes under ice temperature and another 60 minutes at room temperature. To this solution, 10 ml of dry benzene and compound 22 were added and stirred at 22° C. or less. After 1 hour, 50 ml of water, 100 ml of ethyl acetate and a small amount of hydroquinone were added to the reaction liquid. The organic layer was separated and washed with water and saturated saline in order and dried over anhydrous sodium sulfate. After the drying agent was filtered out and the solvent was distilled off, the obtained residue was purified by a silica gel column chromatography to obtain 2.39 g of the desired product with a yield of 96%.

$^1$H-NMR(270 MHz,CDCl$_3$)ppm:7.5-6.7(m,22H,ArH), 6.65(dd,1H,J=17.4,10.9 Hz,—CH═CH$_2$),5.61(d,1H,J=17.6 Hz,—CH═CH$_2$(cis)),5.12(d,1H, J=11.1 Hz,—CH═CH$_2$ (trans)),2.25(s,9H,—CH$_3$),2.08(s,6H,—CH$_3$).

EXAMPLE 7

Synthesis of Boron Homopolymer 1

352 mg of boron monomer compound 1 was placed in an airtight vessel, and thereto was added 5 ml of dry toluene. To this was added 100 μl of a 0.1 M toluene solution of V-601 (manufactured by Wako Pure Chemical Industries, Ltd.), and the resulting liquid was subjected to freeze degassing 5 times. The vessel was closed under vacuum, and the liquid was stirred at 60° C. for 60 hours. After the reaction, the reaction liquid was added to 250 ml of acetone dropwise to generate precipitates. The precipitates were purified by repeating reprecipitation in a toluene-acetone solvent 2 times, and vacuum-dried at 50° C. overnight, to obtain 300 mg of a white solid of boron homopolymer 1. By GPC measurement, it was estimated that the obtained copolymer had a weight average molecular weight (Mw) of 42,000 in terms of polystyrene.

EXAMPLE 8

Synthesis of Boron Homopolymer 2

Boron homopolymer 2 was synthesized by using boron monomer compound 2 in the same manner as in Example 7. By GPC measurement, the weight average molecular weight (Mw) of the obtained copolymer was 78,000 in terms of polystyrene.

EXAMPLE 9

Synthesis of Boron Homopolymer 3

Boron homopolymer 3 was synthesized by using boron monomer compound 7 in the same manner as in Example 7. By GPC measurement, the weight average molecular weight (Mw) of the obtained copolymer was 67,000 in terms of polystyrene.

EXAMPLE 10

Synthesis of Boron Homopolymer 4

Boron homopolymer 4 was synthesized by using boron monomer compound 8 in the same manner as in Example 7. By GPC measurement, the weight average molecular weight (Mw) of the obtained copolymer was 88,000 in terms of polystyrene.

EXAMPLE 11

Synthesis of Boron Homopolymer 5

Boron homopolymer 5 was synthesized by using boron monomer compound 16 in the same manner as in Example 7. By GPC measurement, the weight average molecular weight (Mw) of the obtained copolymer was 88,000 in terms of polystyrene.

EXAMPLE 12

Synthesis of Boron Copolymer 1

0.2 mmol of boron monomer compound 1 and 0.2 mmol of compound 20 were placed in an airtight vessel, and thereto was added 2 ml of dry toluene. To this was added 40μl of a 0.1 M toluene solution of V-601 (manufactured by Wako Pure Chemical Industries, Ltd.), and the resulting liquid was subjected to freeze degassing 5 times. The vessel was closed under vacuum, and the liquid was stirred at 60° C. for 60 hours. After the reaction, the reaction liquid was added to 100 ml of acetone dropwise to generate precipitates. The precipitates were purified by repeating precipitation in a toluene-acetone solvent 2 times, and vacuum-dried at 50° C. overnight, to obtain 158 mg of a pale yellow solid of boron copolymer 1. By GPC measurement, the weight average molecular weight (Mw) of the obtained copolymer was 70,000 in terms of polystyrene. The copolymerization ratio (by mol) estimated by NMR measurement was 50 (boron monomer compound 1):50 (compound 20).

EXAMPLE 13

Synthesis of Boron Copolymer 2

Boron copolymer 2 was synthesized by using boron monomer compound 2 and compound 20 in the same manner as in Example 12. By GPC measurement, the weight average molecular weight (Mw) of the obtained copolymer was 82,000 in terms of polystyrene. The copolymerization ratio (by mol) estimated by NMR measurement was 50 (boron monomer compound 2):50 (compound 20).

EXAMPLE 14

Synthesis of Boron Copolymer 3

Boron copolymer 3 was synthesized by using boron monomer compound 7 and compound 20 in the same manner as in Example 12. By GPC measurement, the weight average molecular weight (Mw) of the obtained copolymer was 69,000 in terms of polystyrene. The copolymerization ratio (by mol) estimated by NMR measurement was 51 (boron monomer compound 7):49 (compound 20).

EXAMPLE 15

Synthesis of Boron Copolymer 4

Boron copolymer 4 was synthesized by using boron monomer compound 8 and compound 20 in the same manner as in Example 12. By GPC measurement, the weight average molecular weight (Mw) of the obtained copolymer was 88,000 in terms of polystyrene. The copolymerization ratio (by mol) estimated by NMR measurement was 52 (boron monomer compound 8):48 (compound 20).

EXAMPLE 16

Synthesis of Boron Copolymer 5

Boron copolymer 5 was synthesized by using boron monomer compound 16 and compound 20 in the same manner as in Example 12. By GPC measurement, the weight average molecular weight (Mw) of the obtained copolymer was 81,000 in terms of polystyrene. The copolymerization ratio (by mol) estimated by NMR measurement was 52 (boron monomer compound 16):48 (compound 20).

EXAMPLE 17

Synthesis of Boron Copolymer 6

0.4 mmol of boron monomer compound 1 and 0.04 mmol of IrST represented by formula (5) (synthesized by the method described in JP-A-2003-113246) were placed in an airtight vessel, and thereto was added 2 ml of dry toluene. To this was added 40 µl of a 0.1 M toluene solution of V-601 (manufactured by Wako Pure Chemical Industries, Ltd.), and the resulting liquid was subjected to freeze degassing 5 times. The vessel was closed under vacuum, and the liquid was stirred at 60° C. for 60 hours. After the reaction, the reaction liquid was added to 100 ml of acetone dropwise to generate precipitates. The precipitates were purified by repeating precipitation in a toluene-acetone solvent 2 times, and vacuum-dried at 50° C. overnight, to obtain 135 mg of a pale yellow solid of boron copolymer. By GPC measurement, the weight average molecular weight (Mw) of the obtained copolymer was 50,000 in terms of polystyrene. The iridium content in the copolymer was 3.7 wt % by ICP elementary analysis. From this result, the copolymerization ratio (by mol) was 92 (boron monomer compound 1):8 (IrST).

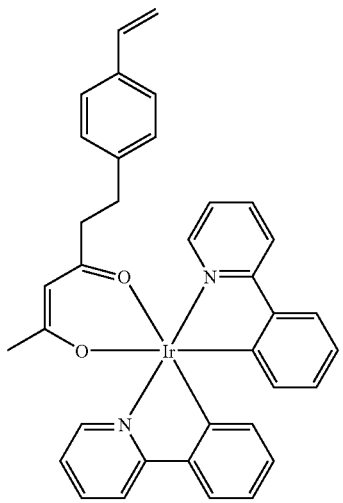

(5)

EXAMPLE 18

Synthesis of Boron Copolymer 7

Boron copolymer 7 was synthesized by using boron monomer compound 2 and IrST in the same manner as in Example 17. By GPC measurement, the weight average molecular weight (Mw) of the obtained copolymer was 50,700 in terms of polystyrene. Based on the iridium content in the copolymer measured by ICP elementary analysis, the copolymerization ratio (by mol) was 92:8 (boron monomer compound 2: IrST).

EXAMPLE 19

Synthesis of Boron Copolymer 8

Boron copolymer 8 was synthesized by using boron monomer compound 7 and IrST in the same manner as in Example 17. By GPC measurement, the weight average molecular weight (Mw) of the obtained copolymer was 59,900 in terms of polystyrene. Based on the iridium content in the copolymer measured by ICP elementary analysis, the copolymerization ratio (by mol) was 91:9 (boron monomer compound 7: IrST).

EXAMPLE 20

Synthesis of Boron Copolymer 9

Boroncopolymer 9 was synthesized by using boron monomer compound 8 and IrST in the same manner as in Example 17. By GPC measurement, the weight average molecular weight (Mw) of the obtained copolymer was 61,700 in terms of polystyrene. Based on the iridium content in the copolymer measured by ICP elementary analysis, the copolymerization ratio (by mol) was 91:9 (boron monomer compound 8: IrST).

EXAMPLE 21

Synthesis of Boron Copolymer 10

Boron copolymer 10 was synthesized by using boron monomer compound 16 and IrST in the same manner as in Example 17. By GPC measurement, the weight average molecular weight (Mw) of the obtained copolymer was 58,700 in terms of polystyrene. Based on the iridium content in the copolymer measured by ICP elementary analysis, the copolymerization ratio (by mol) was 91:9 (boron monomer compound 16: IrST).

EXAMPLE 22

Synthesis of Boron Copolymer 11

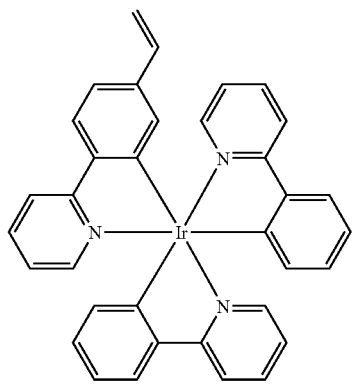

(6)

0.4 mmol of boron monomer compound 1 and 0.04 mmol of Ir complex represented by formula (6) were placed in an airtight vessel, and thereto was added 2 ml of dry toluene. To this was added 40 μl of a 0.1 M toluene solution of V-601 (manufactured by Wako Pure Chemical Industries, Ltd.), and the resulting liquid was subjected to freeze degassing 5 times. The vessel was closed under vacuum, and the liquid was stirred at 60° C. for 60 hours. After the reaction, the reaction liquid was added to 100 ml of acetone dropwise to generate precipitates. The precipitates were purified by repeating precipitation in a toluene-acetone solvent 2 times, and vacuum-dried at 50° C. overnight, to obtain 135 mg of a pale yellow solid of boron copolymer. By GPC measurement, the weight average molecular weight (Mw) of the obtained copolymer was 49,000 in terms of polystyrene. The iridium content in the copolymer was 3.7 wt % by ICP elementary analysis. From this result, the copolymerization ratio (by mol) was 92:8 (boron monomer compound 1:compound represented by formula (6)).

The compound of formula (6) can be synthesized, for example, by the following process.

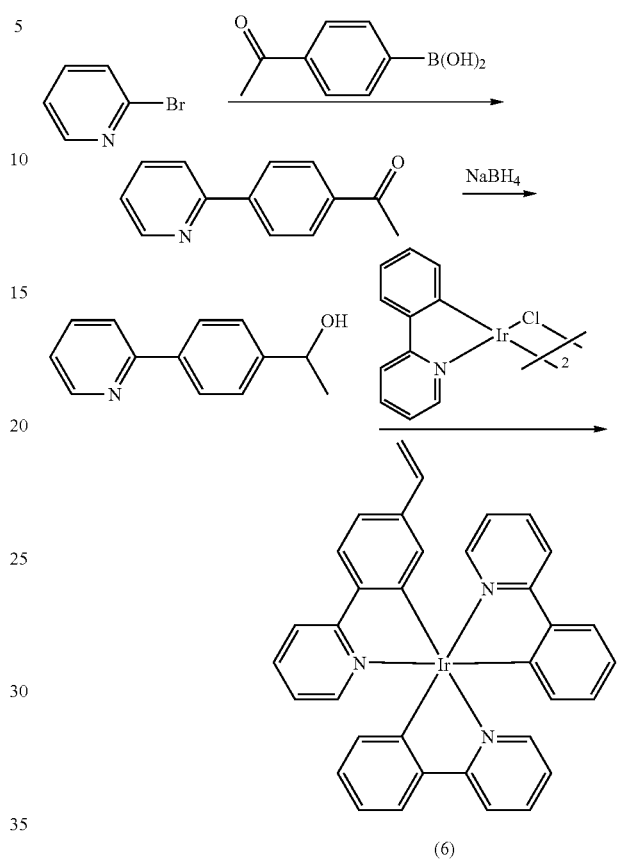

(6)

4-acetylphenylpyridine prepared by reacting 4-acetylphenylboronic acid and 2-bromopyridine in the presence of a palladium compound was reduced with sodium boron hydride to obtain an alcohol. By reacting the alcohol with an Ir binuclear compound prepared in accordance with the method described JP-A-2003-113246 to obtain a compound represented by formula (6).

EXAMPLE 23

Synthesis of Boron Copolymer 12

Boron copolymer 12 was synthesized by using boron monomer compound 2 and compound represented by formula (6) in the same manner as in Example 22. By GPC measurement, the weight average molecular weight (Mw) of the obtained copolymer was 52,200 in terms of polystyrene. Based on the iridium content in the copolymer measured by ICP elementary analysis, the copolymerization ratio (by mol) was 92:8 (boron monomer compound 2: compound represented by formula (6)).

EXAMPLE 24

Synthesis of Boron Copolymer 13

Boron copolymer 13 was synthesized by using boron monomer compound 7 and compound represented by formula (6) in the same manner as in Example 22. By GPC measurement, the weight average molecular weight (Mw) of the obtained copolymer was 60,100 in terms of polystyrene. Based on the iridium content in the copolymer measured by ICP elementary analysis, the copolymerization ratio (by mol) was 91:9 (boron monomer compound 7: compound represented by formula (6)).

EXAMPLE 25

Synthesis of Boron Copolymer 14

Boron copolymer 14 was synthesized by using boron monomer compound 8 and compound represented by formula (6) in the same manner as in Example 22. By GPC measurement, the weight average molecular weight (Mw) of the obtained copolymer was 62,100 in terms of polystyrene. Based on the iridium content in the copolymer measured by ICP elementary analysis, the copolymerization ratio (by mol) was 91:9 (boron monomer compound 8: compound represented by formula (6)).

EXAMPLE 26

Synthesis of Boron Copolymer 15

Boron copolymer 15 was synthesized by using boron monomer compound 16 and compound represented by formula (6) in the same manner as in Example 22. By GPC measurement, the weight average molecular weight (Mw) of the obtained copolymer was 58,700 in terms of polystyrene. Based on the iridium content in the copolymer measured by ICP elementary analysis, the copolymerization ratio (by mol) was 91:9 (boron monomer compound 16: compound represented by formula (6)).

EXAMPLE 27

Synthesis of Boron Copolymer 16

0.2 mmol of boron monomer compound 1, 0.2 mmol of compound 20 and 0.03 mmol of IrST were placed in an airtight vessel, and thereto was added 2 ml of dry toluene. To this was added 40 µl of a 0.1 M toluene solution of V-601 (manufactured by Wako Pure Chemical Industries, Ltd.), and the resulting liquid was subjected to freeze degassing 5 times. The vessel was closed under vacuum, and the liquid was stirred at 60° C. for 60 hours. After the reaction, the reaction liquid was added to 500 ml of acetone dropwise to generate precipitates. The precipitates were purified by repeating precipitation in a toluene-acetone solvent 2 times, and vacuum-dried at 50° C. overnight, to obtain 180 mg of a pale yellow solid of boron copolymer. By GPC measurement, the weight average molecular weight (Mw) of the obtained copolymer was 52,500 in terms of polystyrene. The iridium content in the copolymer was 1.9 wt % by ICP elementary analysis. From this result and measurement results of $^{13}$C-NMR analysis, the copolymerization ratio (by mol) was 47.6:48.0:4.4 (boron monomer compound 1:Compound 20:IrST).

EXAMPLE 28

Synthesis of Boron Copolymer 17

Boron copolymer 17 was synthesized by using boron monomer compound 2, compound 20 and IrST in the same manner as in Example 27. By GPC measurement, the weight average molecular weight (Mw) of the obtained copolymer was 55,200 in terms of polystyrene. Based on the measurement results by ICP elementary analysis and $^{13}$C-NMR analysis, the copolymerization ratio (by mol) was 47.5:48.1:4.4 (boron monomer compound 2:compound 20:IrST).

EXAMPLE 29

Synthesis of Boron Copolymer 18

Boron copolymer 18 was synthesized by using boron monomer compound 7, compound 20 and IrST in the same manner as in Example 27. By GPC measurement, the weight average molecular weight (Mw) of the obtained copolymer was 58,400 in terms of polystyrene. Based on the measurement results by ICP elementary analysis and $^{13}$C-NMR analysis, the copolymerization ratio (by mol) was 47.6:48.0:4.4 (boron monomer compound 7:compound 20:IrST).

EXAMPLE 30

Synthesis of Boron Copolymer 19

Boron copolymer 19 was synthesized by using boron monomer compound 8, compound 20 and IrST in the same manner as in Example 27. By GPC measurement, the weight average molecular weight (Mw) of the obtained copolymer was 58,200 in terms of polystyrene. Based on the measurement results by ICP elementary analysis and $^{13}$C-NMR analysis, the copolymerization ratio (by mol) was 47.4:48.0:4.6 (boron monomer compound 8:compound 20:IrST).

EXAMPLE 31

Synthesis of Boron Copolymer 20

Boron copolymer 20 was synthesized by using boron monomer compound 16, compound 20 and IrST in the same manner as in Example 27. By GPC measurement, the weight average molecular weight (Mw) of the obtained copolymer was 58,200 in terms of polystyrene. Based on the measurement results by ICP elementary analysis and $^{13}$C-NMR analysis, the copolymerization ratio (by mol) was 47.7:47.6:4.7 (boron monomer compound 16:compound 20:IrST).

EXAMPLE 32

Synthesis of Boron Copolymer 21

0.2 mmol of boron monomer compound 1 and 0.2 mmol of compound 20 and 0.03 mmol of compound represented by formula (6) were placed in an airtight vessel, and thereto was added 2 ml of dry toluene. To this was added 40µl of a 0.1 M toluene solution of V-601 (manufactured by Wako Pure Chemical Industries, Ltd.), and the resulting liquid was subjected to freeze degassing 5 times. The vessel was closed under vacuum, and the liquid was stirred at 60° C. for 60 hours. After the reaction, the reaction liquid was added to 500 ml of acetone dropwise to generate precipitates. The precipitates were purified by repeating precipitation in a toluene-acetone solvent 2 times, and vacuum-dried at 50° C. overnight, to obtain 180 mg of a pale yellow solid of boron copolymer. By GPC measurement, the weight average molecular weight (Mw) of the obtained copolymer was 70,000 in terms of polystyrene. The iridium content in the copolymer was 1.9 wt % by ICP elementary analysis. From this result and measurement results of $^{13}$C-NMR analysis, the copolymerization ratio (by mol) was 47.6:48.0:4.4 (boron monomer compound 1:Compound 20:compound represented by formula (6)).

EXAMPLE 33

Synthesis of Boron Copolymer 22

Boron copolymer 22 was synthesized by using boron monomer compound 2, compound 20 and compound represented by formula (6) in the same manner as in Example 32. By GPC measurement, the weight average molecular weight (Mw) of the obtained copolymer was 50,200 in terms of polystyrene. Based on the measurement results by ICP elementary analysis and $^{13}$C-NMR analysis, the copolymerization ratio (by mol) was 47.5:48.1:4.4 (boron monomer compound 2:compound 20:compound represented by formula (6)).

EXAMPLE 34

Synthesis of Boron Copolymer 23

Boron copolymer 23 was synthesized by using boron monomer compound 7, compound 20 and compound represented by formula (6) in the same manner as in Example 32. By GPC measurement, the weight average molecular weight (Mw) of the obtained copolymer was 68,000 in terms of polystyrene. Based on the measurement results by ICP elementary analysis and $^{13}$C-NMR analysis, the copolymerization ratio (by mol) was 47.6:48.0:4.4 (boron monomer compound 7:compound 20:compound represented by formula (6)).

EXAMPLE 35

Synthesis of Boron Copolymer 24

Boron copolymer 24 was synthesized by using boron monomer compound 8, compound 20 and compound represented by formula (6) in the same manner as in Example 32. By GPC measurement, the weight average molecular weight (Mw) of the obtained copolymer was 58,900 in terms of polystyrene. Based on the measurement results by ICP elementary analysis and $^{13}$C-NMR analysis, the copolymerization ratio (by mol) was 47.4:48.0:4.6 (boron monomer compound 8:compound 20:compound represented by formula (6)).

EXAMPLE 36

Synthesis of Boron Copolymer 25

Boron copolymer 25 was synthesized by using boron monomer compound 16, compound 20 and compound represented by formula (6) in the same manner as in Example 32. By GPC measurement, the weight average molecular weight (Mw) of the obtained copolymer was 70,500 in terms of polystyrene. Based on the measurement results by ICP elementary analysis and $^{13}$C-NMR analysis, the copolymerization ratio (by mol) was 47.7:47.6:4.7 (boron monomer compound 16:compound 20:compound represented by formula (6)).

COMPARATIVE EXAMPLE 1

Synthesis of poly-viPBD 0.4 mmol of viPBD was placed in an airtight vessel, and thereto was added 5 ml of dry toluene. To this was added 100 µl of a 0.1 M toluene solution of V-601 (manufactured by Wako Pure Chemical Industries, Ltd.), and the resulting liquid was subjected to freeze degassing 5 times. The vessel was closed under vacuum, and the liquid was stirred at 60° C. for 60 hours. After the reaction, the reaction liquid was added to 250 ml of acetone dropwise to generate precipitates. The precipitates were purified by repeating reprecipitation in a toluene-acetone solvent 2 times, and vacuum-dried at 50° C. overnight, to obtain 130 mg of a white solid of poly- viPBD. By GPC measurement, it was estimated that the obtained copolymer had a weight average molecular weight (Mw) of 67,000 in terms of polystyrene.

COMPARATIVE EXAMPLE 2

Synthesis of Copolymer (poly-viPBD-co-viHMTPD)

Copolymer (poly-viPBD-co-viHMTPD) was synthesized by using viPBD and compound 20 in the same manner as in Example 12. By GPC measurement, the weight average molecular weight (Mw) of the obtained copolymer was 68,400 in terms of polystyrene. The copolymerization ratio (by mol) was 50:50 (viPBD:Compound 20).

COMPARATIVE EXAMPLE 3

Synthesis of Copolymer (poly-(viPBD-co-IrST))

Copolymer (poly-viPBD-co-IrST) was synthesized by using viPBD and IrST in the same manner as in Example 17. By GPC measurement, the weight average molecular weight (Mw) of the obtained copolymer was 56,000 in terms of polystyrene. The copolymerization ratio (by mol) was 91:9 (viPBD:IrST).

COMPARATIVE EXAMPLE 4

Synthesis of Copolymer (poly-(viPBD-co-viHMTPD-co-IrST))

Copolymer (poly-(viPBD-co-viHMTPD-co-IrST) was synthesized by using viPBD, compound 20 and IrST in the same manner as in Example 22. By GPC measurement, the weight average molecular weight (Mw) of the obtained copolymer was 49,200 in terms of polystyrene. The iridium content in the copolymer was 1.9 wt % by ICP elementary analysis. From this result and measurement results of $^{13}$C-NMR analysis, the copolymerization ratio (by mol) was 49.0: 46.5:4.5 (viPBD:Compound 20:IrST).

EXAMPLE 37

Production of Organic Light Emitting Device and Evaluation of EL Properties

An organic light emitting device was produced using an ITO (indium tin oxide)-coated substrate (Nippo Electric Co., Ltd.) which was a 25-mm-square glass substrate with two 4-mm-width ITO electrodes formed in stripes as an anode on one surface of the substrate. First a poly (3,4-ethylenedioxythiophene) -polystyrene sulfonate (BAYTRON P (trade name) manufactured by Bayer Co.) was applied onto the ITO anode of the ITO-having substrate by a spin coating method under conditions of a rotation rate 3,500 rpm and a coating time 40 seconds, and dried under a reduced pressure at 60° C. for 2 hours in a vacuum drying apparatus, to form an anode buffer layer. The obtained anode buffer layer had a thickness of approximately 50 nm.

Then, a coating solution for forming a layer comprising a light emitting material and an electron transporting material was prepared. Thus, 45 mg of boron copolymer 7 and 45 mg of HMTPD synthesized by a method described in JP-A-10-1665 were dissolved in 2,910 mg of toluene (special grade, manufactured by Wako Pure Chemical Industries, Ltd.), and the obtained solution was passed through a filter with a pore size of 0.2 μm to obtain the coating solution. Next, the prepared coating solution was applied to the anode buffer layer by a spin coating method under conditions of a rotation rate 3,000 rpm and a coating time 30 seconds, and dried at the room temperature (25° C.) for 30 minutes, to form a light emitting layer. The obtained light emitting layer had a thickness of approximately 100 nm. Then the substrate with the light emitting layer was placed in a deposition apparatus, cesium was deposited thereon into a thickness of 2 nm at a deposition rate of 0.01 nm/s (by using an alkali metal dispenser manufactured by Saes Getters as a cesium source), and aluminum was deposited as a cathode into a thickness of 250 nm at a deposition rate of 1 nm/s, to produce device 1. Here the cesium layer and the aluminum layer were each formed into two 3-mm-width stripes perpendicular to the longitudinal direction of the anode, and four 4-mm-long and 3-mm-wide organic light emitting devices were produced per one glass substrate.

The above organic EL device was driven by applying voltage using a programmable direct voltage/current source TR6143 manufactured by Advantest Corporation, and the luminance of the device was measured by a luminance meter BM-8 manufactured by Topcon Corporation. The emission starting voltage, the maximum luminance, and the external quantum efficiency corresponding to the luminance of 100 cd/m$^2$ thus obtained are shown in Table 2 respectively. (Each of the values is an average value of the four devices formed on one substrate.)

Devices 2 to 7 were produced in the same manner as the device 1 except for using the light emitting materials and the other material as shown in Table 1. These devices were evaluated with respect to the EL properties in the same manner as the device 1. The results are shown in Table 2.

It is clear from Tables 1 and 2 that the light emitting devices of the present invention using the luminescent polymers having the electron transporting moieties with the triarylboron structures showed low emission starting voltages, high maximum luminances, and high external quantum efficiencies as compared with the comparative light emitting device using the luminescent polymer having the oxadiazole electron transporting moiety.

TABLE 1

| Device No. | Light-emitting material | other materials |
|---|---|---|
| 1 | boronhomopolymer1(Example7)(45 mg) | HMTPD(45 mg) D-15(10 mg) |
| 2 | boronhomopolymer2(Example8)(45 mg) | HMTPD(45 mg) D-15(10 mg) |
| 3 | boronhomopolymer3(Example9)(45 mg) | HMTPD(45 mg) D-15(10 mg) |
| 4 | boronhomopolymer4(Example10)(45 mg) | HMTPD(45 mg) D-15(10 mg) |
| 5 | boronhomopolymer5(Example11)(45 mg) | HMTPD(45 mg) D-15(10 mg) |
| 6 | boroncopolymer1(Example12)(90 mg) | D-15(10 mg) |
| 7 | boroncopolymer2(Example13)(90 mg) | D-15(10 mg) |
| 8 | boroncopolymer3(Example14)(90 mg) | D-15(10 mg) |
| 9 | boroncopolymer4(Example15)(90 mg) | D-15(10 mg) |
| 10 | boroncopolymer5(Example16)(90 mg) | D-15(10 mg) |
| 11 | boroncopolymer6(Example17)(50 mg) | HMTPD(45 mg) |
| 12 | boroncopolymer7(Example18)(50 mg) | HMTPD(45 mg) |
| 13 | boroncopolymer8(Example19)(50 mg) | HMTPD(45 mg) |
| 14 | boroncopolymer9(Example20)(50 mg) | HMTPD(45 mg) |
| 15 | boroncopolymer10(Example21)(50 mg) | HMTPD(45 mg) |
| 16 | boroncopolymer11(Example22)(50 mg) | HMTPD(45 mg) |
| 17 | boroncopolymer12(Example23)(50 mg) | HMTPD(45 mg) |
| 18 | boroncopolymer13(Example24)(50 mg) | HMTPD(45 mg) |
| 19 | boroncopolymer14(Example25)(50 mg) | HMTPD(45 mg) |
| 20 | boroncopolymer15(Example26)(50 mg) | HMTPD(45 mg) |
| 21 | boroncopolymer16(Example27)(90 mg) | none |
| 22 | boroncopolymer17(Example28)(90 mg) | none |
| 23 | boroncopolymer18(Example29)(90 mg) | none |
| 24 | boroncopolymer19(Example30)(90 mg) | none |
| 25 | boroncopolymer20(Example31)(90 mg) | none |
| 26 | boroncopolymer21(Example32)(90 mg) | none |
| 27 | boroncopolymer22(Example33)(90 mg) | none |
| 28 | boroncopolymer23(Example34)(90 mg) | none |
| 29 | boroncopolymer24(Example35)(90 mg) | none |
| 30 | boroncopolymer25(Example36)(90 mg) | none |
| 31 | (Comparative Example1)(45 mg) | HMTPD(45 mg) D-15(10 mg) |
| 32 | (Comparative Example2)(90 mg) | D-15(10 mg) |
| 33 | (Comparative Example3)(50 mg) | HMTPD(45 mg) |
| 34 | (Comparative Example4)(90 mg) | none |

TABLE 2

| Device No. | Emission Starting Voltage (V) | Maximum luminance (cd/m$^2$) | External quantum efficiency (%) |
|---|---|---|---|
| 1 | 2.5 | 32000 | 4.9 |
| 2 | 2.6 | 68000 | 6.9 |
| 3 | 2.6 | 64000 | 6.8 |
| 4 | 2.5 | 100000 | 6.7 |
| 5 | 2.5 | 88000 | 6.8 |
| 6 | 2.5 | 33000 | 4.0 |
| 7 | 2.6 | 78000 | 6.6 |
| 8 | 2.6 | 81000 | 7.0 |
| 9 | 2.5 | 160000 | 9.2 |
| 10 | 2.5 | 100000 | 8.9 |
| 11 | 2.5 | 38000 | 5.0 |
| 12 | 2.5 | 70200 | 7.9 |
| 13 | 2.5 | 70000 | 7.5 |
| 14 | 2.5 | 72000 | 7.4 |
| 15 | 2.5 | 73000 | 7.4 |
| 16 | 2.5 | 34000 | 4.9 |
| 17 | 2.5 | 80000 | 8.0 |
| 18 | 2.5 | 80000 | 7.9 |
| 19 | 2.5 | 100000 | 8.8 |
| 20 | 2.5 | 83000 | 8.1 |
| 21 | 2.6 | 35000 | 5.2 |
| 22 | 2.5 | 80000 | 8.3 |
| 23 | 2.5 | 80500 | 8.4 |
| 24 | 2.5 | 134000 | 9.1 |
| 25 | 2.5 | 98000 | 9.1 |
| 26 | 2.5 | 35000 | 5.2 |
| 27 | 2.5 | 80000 | 8.3 |
| 28 | 2.5 | 80500 | 8.4 |
| 29 | 2.4 | 155000 | 9.8 |
| 30 | 2.4 | 108000 | 9.0 |
| 31 | 2.7 | 28000 | 3.3 |
| 32 | 2.6 | 40000 | 5.1 |
| 33 | 2.8 | 29000 | 4.0 |
| 34 | 2.8 | 33000 | 3.9 |

INDUSTRIAL APPLICABILITY

By using the polymer compound according to the present invention, there are provided the luminescent polymer material and the organic light emitting device using the same, which are capable of showing a high light emitting efficiency at a low voltage and suitable for increasing the emission area and for mass production.

The invention claimed is:

1. A polymer compound characterized by comprising a monomer unit represented by formula (2):

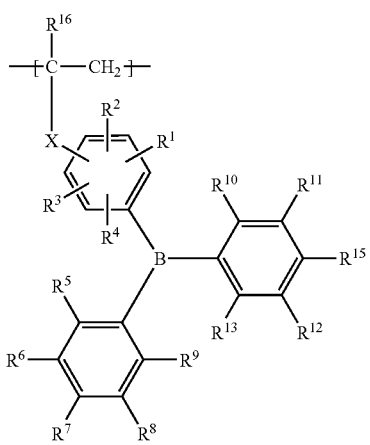

(2)

wherein $R^{16}$ represents a hydrogen atom or an alkyl group having 1 to 12 carbon atoms; X represents a single bond, —O—, —S—, —SO—, —SO$_2$— or a divalent hydrocarbon group having 1 to 20 carbon atoms which may have a hetero atom; and $R^1$ to $R^{15}$ independently represent a hydrogen atom, a halogen atom, a cyano group, an amino group, a hydrocarbon alkyl group having 1 to 12 carbon atoms, an alkoxy group having 1 to 12 carbon atoms, an aryloxy group, an aromatic group or a heterocyclic group; and wherein among $R^1$ to $R^{15}$, those adjacent to each other on one phenyl group may be bonded to form a condensed ring.

2. The polymer compound as claimed in claim 1, wherein in the monomer unit represented by formula (2), at least four of $R^1, R^4, R^5, R^9, R^{10}$ and $R^{13}$ each represent an alkyl group having 1 to 6 carbon atoms or alkoxy group having 1 to 6 carbon atoms (provided that $R^1$ and $R^4$ are at ortho positions with respect to the substitution position of the boron atom).

3. The polymer compound as claimed in claim 1, comprising a monomer unit represented by formula (3):

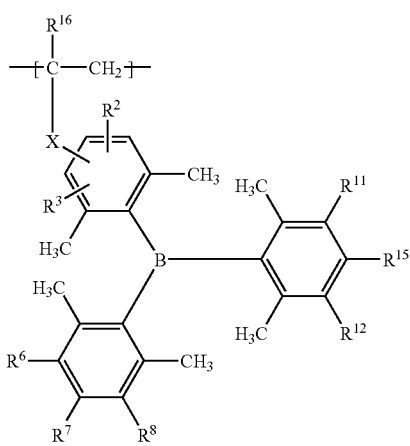

(3)

wherein, $R^2, R^3, R^6$ to $R^8, R^{11}, R^{12}, R^{15}$ and $R^{16}$ represent the same meanings as defined in formula (2).

4. The polymer compound as claimed in claim 1, comprising a monomer unit represented by formula (4):

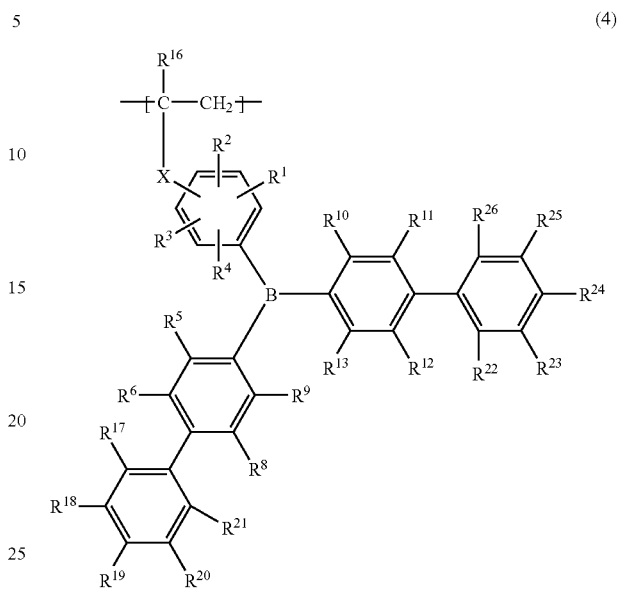

(4)

wherein $R^1$ to $R^6$, $R^8$ to $R^{13}$ and $R^{16}$ have the same meanings as defined in formula (2) respectively, $R^{17}$ $R^{26}$ independently represent a hydrogen atom, a halogen atom, a cyano group, an amino group, a hydrocarbon alkyl group having 1 to 12 carbon atoms, an alkoxy group having 1 to 12 carbon atoms, an aryloxy group, an aromatic group or a heterocyclic group, and wherein among $R^{17}$ $R^{26}$, those adjacent to each other on one phenyl group may be bonded with each other to form a condensed ring.

5. The polymer compound as claimed in claim 1, which is a light-emitting polymer compound comprising the monomer unit represented by formula (2) described in claim 1 and a light-emitting monomer unit.

6. The light-emitting polymer compound as claimed in claim 5, wherein light emitted by the light-emitting monomer unit is phosphorescence.

7. The light-emitting polymer compound as claimed in claim 6, wherein the light-emitting monomer contains a transition metal complex.

8. The light-emitting polymer compound as claimed in claim 7, wherein the light-emitting monomer unit contains a metal selected from metals of atomic numbers 39 to 48 and 72 to 80.

9. The light-emitting polymer compound as claimed in claim 1, wherein the light-emitting polymer compound contains a hole-transporting monomer unit.

10. A light-emitting composition, comprising a polymer compound containing the monomer unit represented by formula (2) described in claim 1 and a light-emitting compound.

11. The light-emitting composition as claimed in claim 10, wherein the light-emitting compound is a low molecular weight compound or a polymer compound.

12. An organic light-emitting device comprising one or more polymer layers between an anode and a cathode, wherein at least one of the polymer layers present between the anode and the cathode comprises the light-emitting polymer compound described in claim 5.

13. An organic light-emitting device comprising one or more polymer layers between an anode and a cathode, wherein at least one of the polymer layers present between the anode and the cathode comprises the light-emitting composition described in claim 10.

14. A light source for surface emission, a backlight for a display unit, a display unit, an illumination device or an interior or exterior accessory comprising the light emitting device described in claim 12.

* * * * *